US012615858B2

(12) United States Patent
Hamasaki

(10) Patent No.: US 12,615,858 B2
(45) Date of Patent: Apr. 28, 2026

(54) PHOTODETECTION DEVICE AND ELECTRONIC DEVICE

(71) Applicant: SONY SEMICONDUCTOR SOLUTIONS CORPORATION, Kanagawa (JP)

(72) Inventor: Takahiro Hamasaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 368 days.

(21) Appl. No.: 18/551,372

(22) PCT Filed: Feb. 22, 2022

(86) PCT No.: PCT/JP2022/007091
§ 371 (c)(1),
(2) Date: Sep. 19, 2023

(87) PCT Pub. No.: WO2022/209427
PCT Pub. Date: Oct. 6, 2022

(65) Prior Publication Data
US 2024/0194702 A1 Jun. 13, 2024

(30) Foreign Application Priority Data

Mar. 31, 2021 (JP) ................................ 2021-061033

(51) Int. Cl.
*H10F 39/00* (2025.01)
*H10F 39/12* (2025.01)

(52) U.S. Cl.
CPC ..... *H10F 39/8023* (2025.01); *H10F 39/8037* (2025.01); *H10F 39/199* (2025.01)

(58) Field of Classification Search
CPC . H10F 39/8023; H10F 39/8037; H10F 39/199
See application file for complete search history.

(56) References Cited

U.S. PATENT DOCUMENTS 9,673,237 B2 * 6/2017 Kim .................... H10F 39/8033
9,699,398 B2 * 7/2017 Dierickx ............. H10F 39/8023
(Continued)

FOREIGN PATENT DOCUMENTS

JP 2017-163607 A 9/2017
JP 2020-043413 A 3/2020
JP 2021-040048 A 3/2021

OTHER PUBLICATIONS

International Search Report and Written Opinion of PCT Application No. PCT/JP2022/007091, issued on May 24, 2022, 08 pages of ISRWO.

*Primary Examiner* — Eugene Lee
(74) *Attorney, Agent, or Firm* — CHIP LAW GROUP

(57) ABSTRACT

Provided is a technology that enables reliable transfer of signal electric charges. This photodetection device includes a semiconductor layer having a first surface and a second surface located on opposite sides of the semiconductor layer in a thickness direction, a photoelectric conversion part provided in the semiconductor layer, first and second electric charge retaining parts provided adjacent to the first surface of the semiconductor layer, a first transfer transistor that transfers signal electric charges generated by photoelectric conversion in the photoelectric conversion part to the first electric charge retaining part, and a second transfer transistor that transfers the signal electric charges transferred by the first transfer transistor and retained in the first electric charge retaining part to the second electric charge retaining part. Then, the first electric charge retaining part includes a semiconductor region provided adjacent to the first surface of the semiconductor layer, and an electrode placed on the semiconductor region with an insulation film interposed between the electrode and the semiconductor region. Then, an upstream side of the electrode in a direction in which the signal electric charges are transferred is narrower than the (Continued)

downstream side of the electrode in the direction in which
the signal electric charges are transferred.

20 Claims, 32 Drawing Sheets

(56)                    References Cited

U.S. PATENT DOCUMENTS

| | | | | |
|---|---|---|---|---|
| 10,431,622 | B2 * | 10/2019 | Yamashita | H04N 23/12 |
| 10,616,519 | B2 * | 4/2020 | Elkhatib | H04N 25/616 |
| 10,784,304 | B2 * | 9/2020 | Yamashita | H10F 39/1865 |
| 11,044,429 | B2 * | 6/2021 | Choi | H10F 39/80373 |
| 11,627,266 | B2 * | 4/2023 | Jin | H04N 25/705 |
| | | | | 348/140 |
| 12,094,898 | B2 * | 9/2024 | Lei | H10F 39/807 |
| 2011/0037969 | A1 * | 2/2011 | Spickermann | G01S 17/10 |
| | | | | 356/5.01 |
| 2011/0211103 | A1 * | 9/2011 | Sakano | H04N 25/771 |
| | | | | 348/308 |
| 2019/0020835 | A1 | 1/2019 | Takahashi et al. | |
| 2020/0176492 | A1 | 6/2020 | Huang | |
| 2021/0025993 | A1 * | 1/2021 | Choi | H10F 39/80373 |
| 2022/0417460 | A1 * | 12/2022 | Jin | G01S 7/4816 |
| 2025/0324802 | A1 * | 10/2025 | Chung | H10F 39/8053 |

* cited by examiner

11b₄    RST2    AMP2    SEL2    11b

42    A34 ─── ─── A34

41 (41a)

a

VG1    PD    VG2

MEM1    B34    B34

45

TG1

FD1

FD2

TG2    45 a

MEM2    42    41 (41a)

11b₁    SEL1    AMP1    RST1    11b₂

11b₃

Y

X ←───⊙

Z

MEM1

42    45    45    42

S1    45b

30

P

S2    41    44    44    45a    41

(41a)    (41a)

Z

X ←───⊙

Y

PHOTODETECTION DEVICE AND ELECTRONIC DEVICE

CROSS REFERENCE TO RELATED APPLICATIONS

This application is a U.S. National Phase of International Patent Application No. PCT/JP2022/007091 filed on Feb. 22, 2022, which claims priority benefit of Japanese Patent Application No. JP 2021-061033 filed in the Japan Patent Office on Mar. 31, 2021. Each of the above-referenced applications is hereby incorporated herein by reference in its entirety.

TECHNICAL FIELD

The present technology (technology according to the present disclosure) relates to a photodetection device and an electronic device, and particularly relates to a technology effective when applied to a photodetection device and an electronic device each including an electric charge retaining part between two transfer transistors.

BACKGROUND ART

As a photodetection device, a solid-state imaging device having a global shutter method applied thereto is known. Patent Document 1 discloses a pixel structure including a memory part that temporarily accumulates electric charges that are transferred from a photodiode to an electric charge retaining region (floating diffusion). This pixel structure allows the memory part to accumulate signal electric charges generated by photoelectric conversion in the photodiode by controlling a height of a potential barrier present between a photoelectric conversion element and the memory part, thereby implementing a global shutter.

CITATION LIST

Patent Document

Patent Document 1: Japanese Patent Application Laid-Open No. 2020-043413

SUMMARY OF THE INVENTION

Problems to be Solved by the Invention

Meanwhile, when an impurity concentration gradient is formed in the memory part, a gradient from the memory part toward the electric charge retaining region is formed. In a case where the impurity concentration gradient is not properly formed in the memory part, however, unevenness in potential develops, and signal electric charges remain in the unevenness, so that there is a possibility that the signal electric charges cannot be reliably transferred.

It is therefore an object of the present technology to provide a technology that enables reliable transfer of signal electric charges.

Solutions to Problems (1) A photodetection device according to an aspect of the present technology includes:
a semiconductor layer having a first surface and a second surface located on opposite sides of the semiconductor layer in a thickness direction;

a photoelectric conversion part provided in the semiconductor layer;
first and second electric charge retaining parts provided adjacent to the first surface of the semiconductor layer;
a first transfer transistor that transfers signal electric charges generated by photoelectric conversion in the photoelectric conversion part to the first electric charge retaining part; and
a second transfer transistor that transfers the signal electric charges transferred by the first transfer transistor and retained in the first electric charge retaining part to the second electric charge retaining part.

Then, the first electric charge retaining part includes a semiconductor region provided adjacent to the first surface of the semiconductor layer, and an electrode placed on the semiconductor region with an insulation film interposed between the electrode and the semiconductor region.

Then, an upstream side of the electrode in a direction in which the signal electric charges are transferred is narrower than a downstream side of the electrode in the direction in which the signal electric charges are transferred.

(2) A photodetection device according to another aspect of the present technology includes:
a semiconductor layer having a first surface and a second surface located on opposite sides of the semiconductor layer in a thickness direction; and
a plurality of pixels provided in the semiconductor layer.
Then, each of the plurality of pixels includes:
a photoelectric conversion part provided in the semiconductor layer; and
two transfer cells that transfer signal electric charges generated by photoelectric conversion in the photoelectric conversion part to a corresponding second electric charge retaining part.
Then, each of the two transfer cells includes:
a first electric charge retaining part and the second electric charge retaining part provided adjacent to the first surface of the semiconductor layer;
a first transfer transistor that transfers the signal electric charges generated by photoelectric conversion in the photoelectric conversion part to the first electric charge retaining part; and
a second transfer transistor that transfers the signal electric charges transferred by the first transfer transistor and retained in the first electric charge retaining part to the second electric charge retaining part.
Then, the first electric charge retaining part includes:
a semiconductor region provided adjacent to the first surface of the semiconductor layer; and
an electrode placed on the semiconductor region with an insulation film interposed between the electrode and the semiconductor region, and
an upstream side of the electrode in a direction in which the signal electric charges are transferred is narrower than a downstream side of the electrode in the direction in which the signal electric charges are transferred.

(3) An electronic device according to another aspect of the present technology includes a photodetection device described in (1) or (2), and an optical system that forms an image of image light from a subject on the photodetection device.

5

Figures 30, 31A:
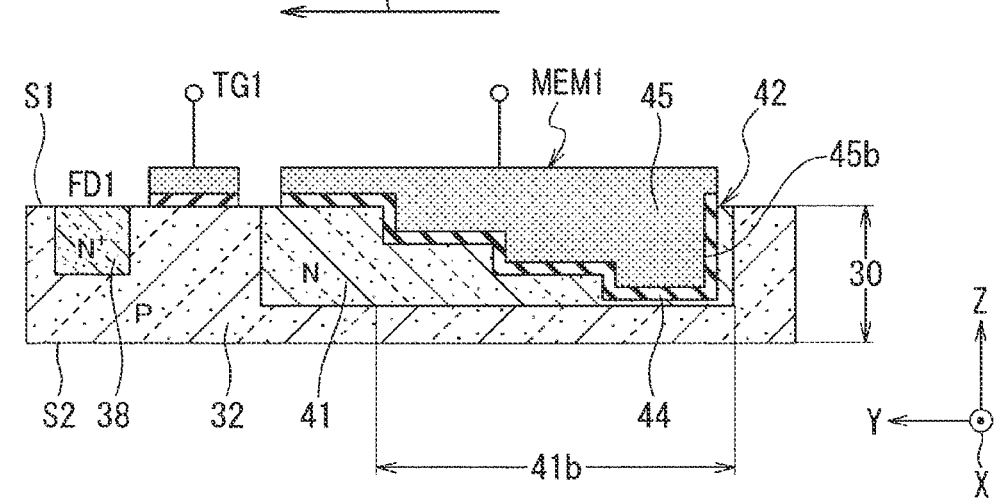
FIG. 30 is a plan view schematically depicting a planar configuration example of a pixel of a ranging sensor according to an eighteenth embodiment of the present technology.
FIG. 31A is a cross-sectional view schematically depicting a cross-sectional structure taken along a line A30-A30 in FIG. 30.
Figure 31B:
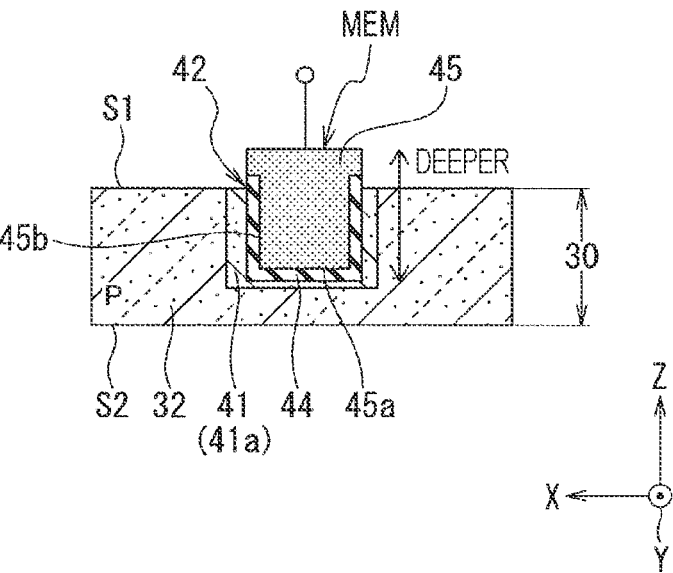

FIG. 31B is a cross-sectional view schematically depicting a cross-sectional structure taken along a line B30-B30 in FIG. 30.

Figure 31C:
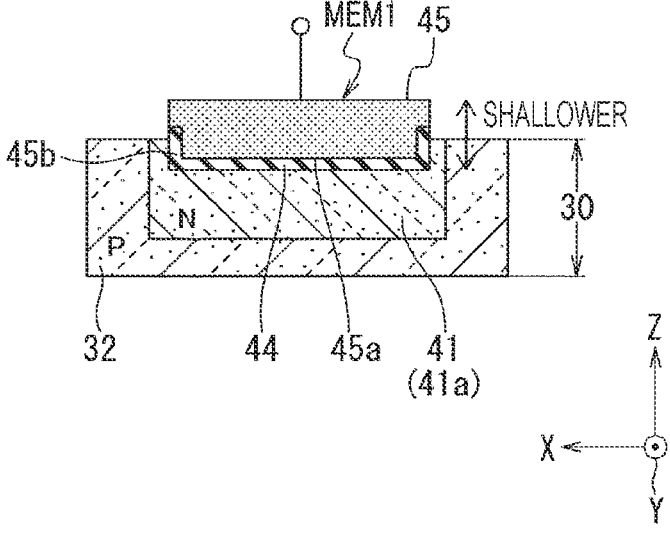

FIG. 31C is a cross-sectional view schematically depicting a cross-sectional structure taken along a line C30-C30 in FIG. 30.

Figure 32:
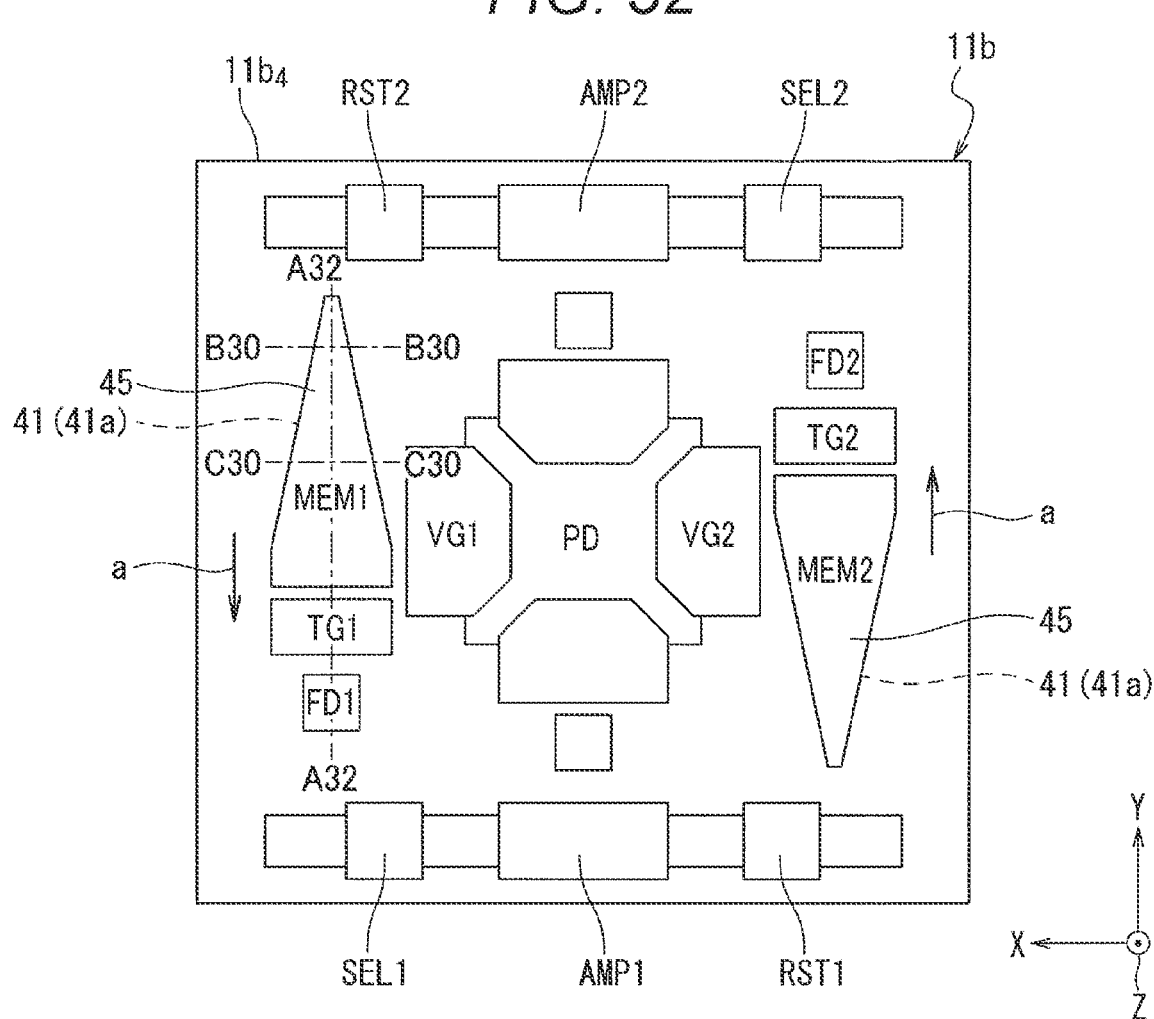

FIG. 32 is a plan view schematically depicting a planar configuration example of a pixel of a ranging sensor according to a nineteenth embodiment of the present technology.

Figure 33:
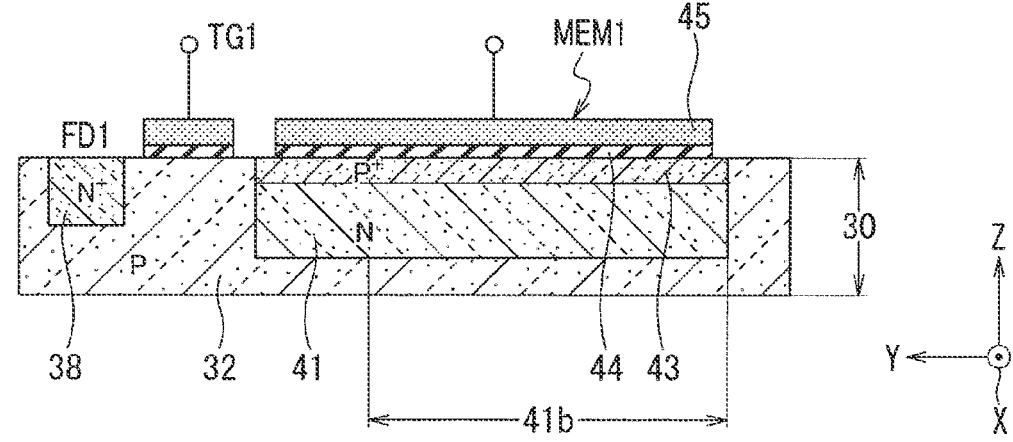

FIG. 33 is a cross-sectional view schematically depicting a cross-sectional structure taken along a line A32-A32 in FIG. 32.

Figures 34, 35A:
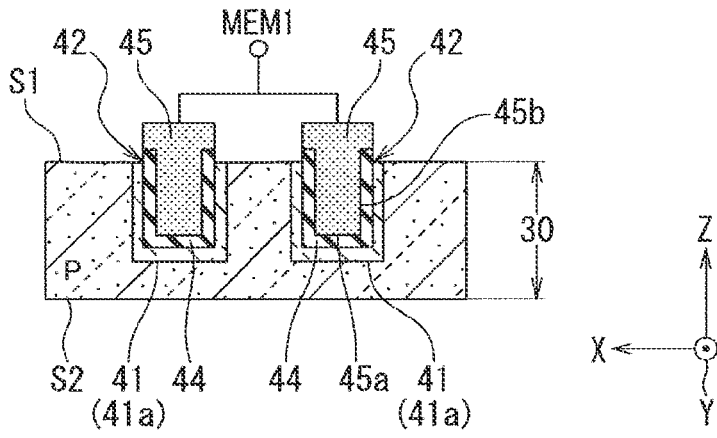

FIG. 34 is a plan view schematically depicting a planar configuration example of a pixel of a ranging sensor according to a twentieth embodiment of the present technology.

FIG. 35A is a cross-sectional view schematically depicting a cross-sectional structure taken along a line A34-A34 in FIG. 34.

Figure 35B:
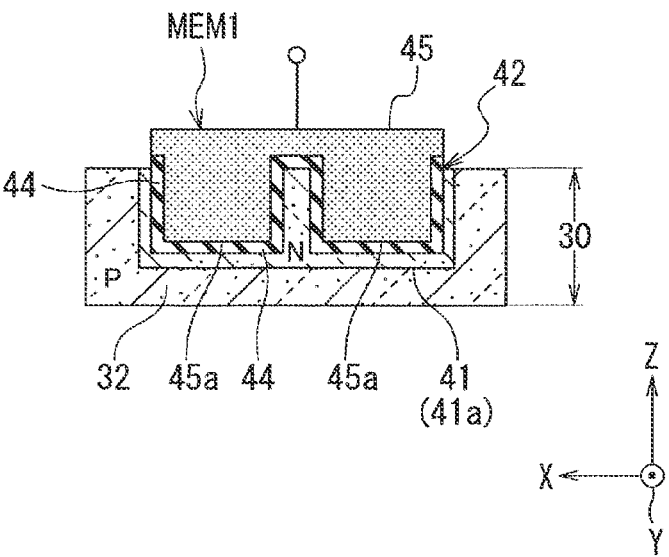

FIG. 35B is a cross-sectional view schematically depicting a cross-sectional structure taken along a line B34-B34 in FIG. 34.

Figure 36:
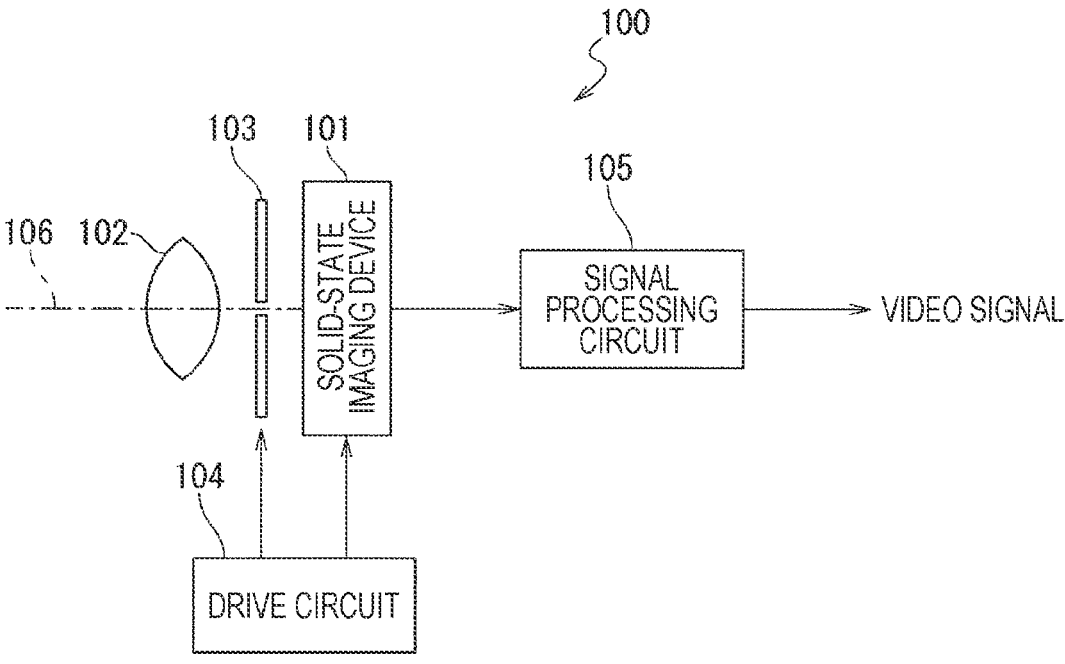

FIG. 36 is a diagram depicting a schematic configuration of an electronic device according to a twenty-first embodiment of the present technology.

MODE FOR CARRYING OUT THE INVENTION

Hereinafter, embodiments of the present technology will be described in detail with reference to the drawings.

In the description of the drawings referred to in the following description, the same or similar parts are denoted by the same or similar reference signs. It should be noted that the drawings are schematic, and a relationship between a thickness and a planar dimension, a ratio of the thicknesses between layers and the like are different from actual ones. Therefore, specific thicknesses and dimensions should be determined in consideration of the following description.

Furthermore, it goes without saying that dimensional relationships and ratios are partly different between the drawings. Furthermore, the effects described herein are merely examples and are not limited, and other effects may be provided.

Furthermore, the following embodiments illustrate a device and a method for embodying the technical idea of the present technology, and do not specify the configuration as follows. That is, various modifications can be made to the technical idea of the present technology within the technical scope described in the claims.

Furthermore, the definitions of directions such as up and down in the following description are merely defined for convenience of description, and do not limit the technical idea of the present technology. For example, it goes without saying that if a target is observed while being rotated by 90°, the upward and downward directions are converted into rightward and leftward directions, and if the target is observed while being rotated by 180°, the upward and downward directions are inverted.

Furthermore, in the following embodiments, in three directions orthogonal to each other in a space, a first direction and a second direction orthogonal to each other in the same plane are defined as an X direction and a Y direction, respectively, and a third direction orthogonal to the first direction and the second direction is defined as a Z direction. Then, in the following embodiments, a thickness direction of a semiconductor layer 30 to be described below will be described as the Z direction.

First Embodiment

In the first embodiment, an example where the present technology (technology according to the present disclosure) is applied to a solid-state imaging device that is a back-illuminated complementary metal oxide semiconductor (CMOS) image sensor as a photodetection device will be described.

<<Overall Configuration of Solid-State Imaging Device>>

First, an overall configuration of a solid-state imaging device 1A will be described.

Figure 1:
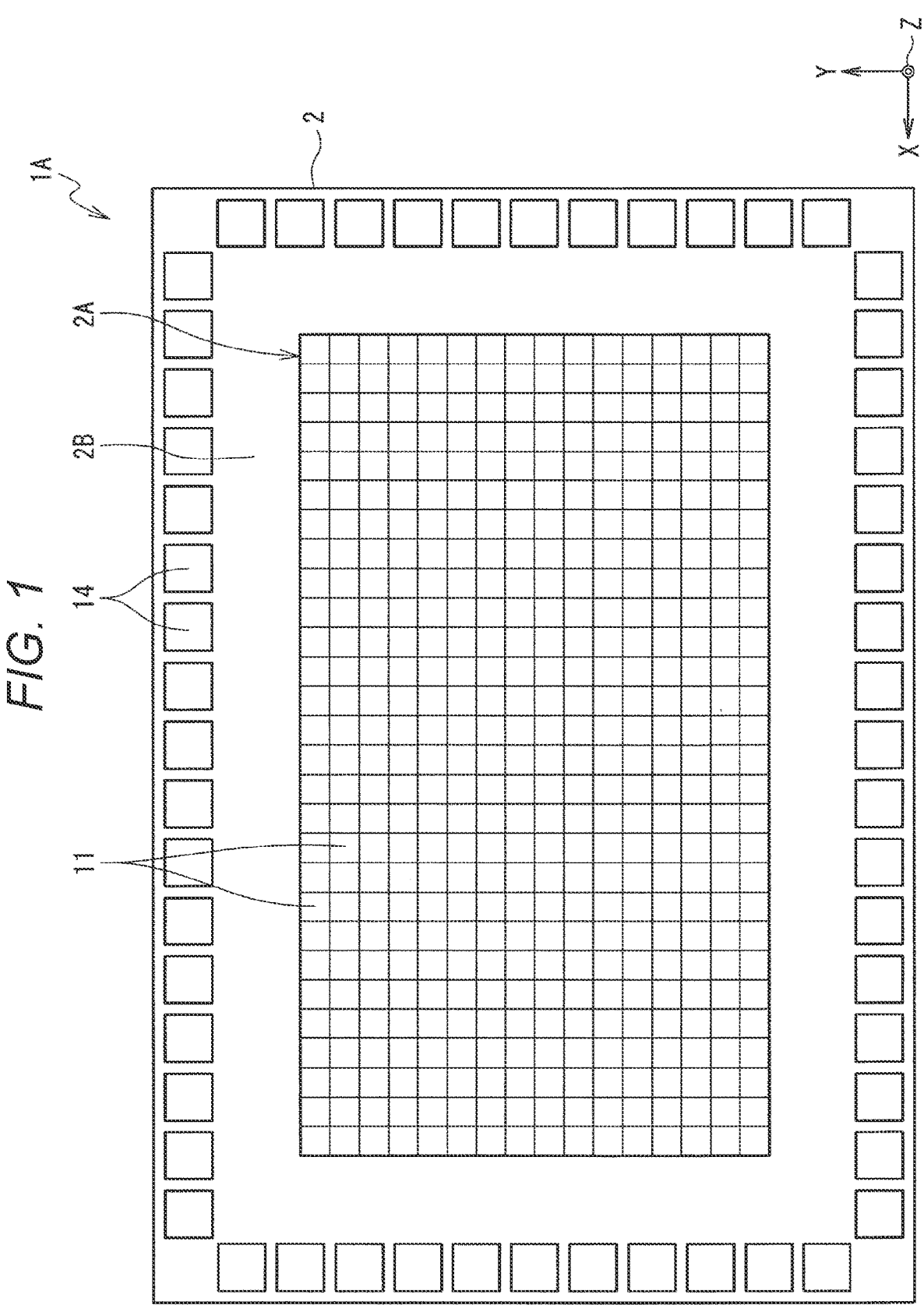
FIG. 1 is a planar layout diagram depicting a configuration example of a solid-state imaging device according to a first embodiment of the present technology.

As depicted in FIG. 1, the solid-state imaging device 1A according to the first embodiment of the present technology mainly includes a semiconductor chip 2 having a rectangular two-dimensional planar shape in plan view. That is, the solid-state imaging device 1A is mounted on the semiconductor chip 2. As depicted in FIG. 36, the solid-state imaging device 1A (101) receives image light (incident light 106) from a subject through an optical lens 102, converts an amount of the incident light 106 formed as an image on an imaging surface into an electrical signal for each pixel, and outputs the electrical signal as a pixel signal.

As depicted in FIG. 1, the semiconductor chip 2 on which the solid-state imaging device 1A is mounted includes, in a two-dimensional plane including the X direction and the Y direction orthogonal to each other, a rectangular pixel array unit 2A provided in a central portion, and a peripheral portion 2B provided outside the pixel array unit 2A so as to surround the pixel array unit 2A.

The pixel array unit 2A is, for example, a light receiving surface that receives light condensed by the optical lens (optical system) 102 depicted in FIG. 36. Then, in the pixel array unit 2A, a plurality of pixels 11 is arranged in a matrix in the two-dimensional plane including the X direction and the Y direction. In other words, the pixels 11 are repeatedly arranged in the X direction and the Y direction orthogonal to each other in the two-dimensional plane.

As depicted in FIG. 1, a plurality of bonding pads 14 is arranged in the peripheral portion 2B. Each of the plurality of bonding pads 14 is arranged, for example, along each of the four sides in the two-dimensional plane of the semiconductor chip 2. Each of the plurality of bonding pads 14 is an input-output terminal used when the semiconductor chip 2 is electrically connected to an external device.

Figures 2, 3:
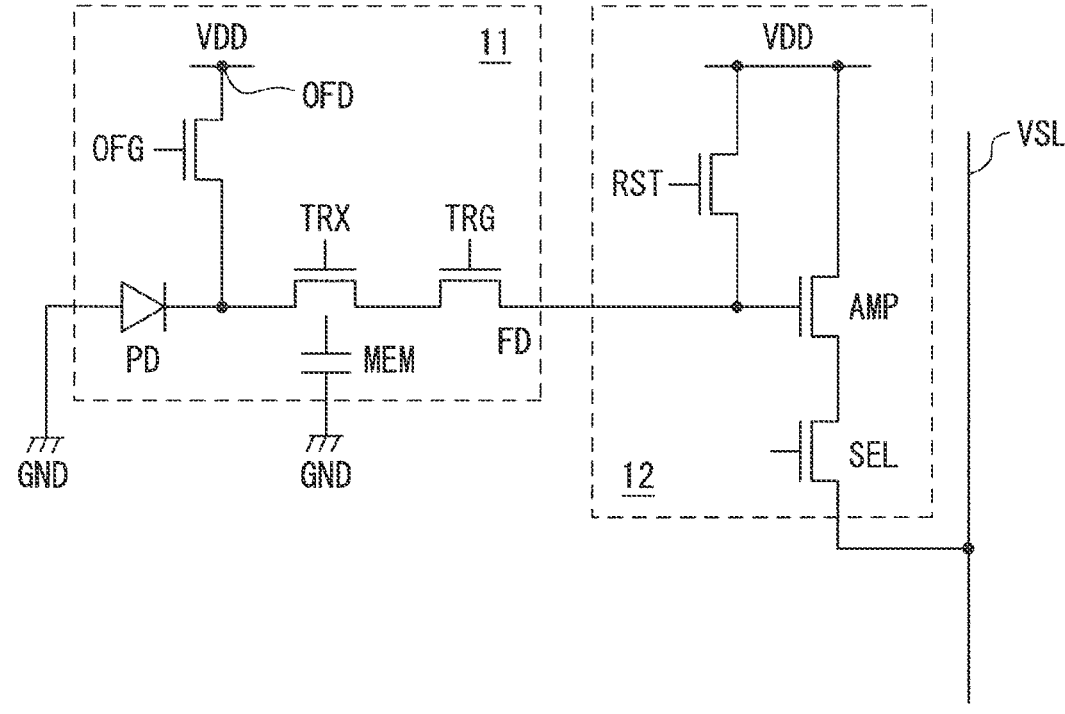
FIG. 2 is a block diagram depicting a configuration example of the solid-state imaging device according to the first embodiment of the present technology.
FIG. 3 is an equivalent circuit diagram depicting a configuration example of a pixel and a readout circuit in FIG. 2.

As depicted in FIG. 2, the solid-state imaging device 1A includes the pixel array unit 2A and a logic circuit 20. The pixel array unit 2A includes the plurality of pixels (sensor pixels) 11 and a plurality of readout circuits 12 (see FIG. 3). Each of the pixels 11 performs photoelectric conversion and outputs electric charges corresponding to the amount of received light. The plurality of pixels 11 is arranged to face a light receiving surface S1 (see FIGS. 4A and 4B) and is arranged in a matrix in the pixel array unit 2A. Each of the readout circuits 12 outputs a pixel signal based on the electric charges output from a corresponding one of the pixels 11. The plurality of readout circuits 12 is provided one by one for each pixel 11 in the pixel array unit 2A, for example. Note that the plurality of readout circuits 12 may be provided one by one for every plurality of pixels 11 in the pixel array unit 2A.

As depicted in FIG. 2, the pixel array unit 2A includes a plurality of pixel drive lines HSL and a plurality of data output lines VSL. The pixel drive lines HSL are wiring to which a control signal for controlling the output of the electric charges accumulated in the pixels 11 is applied, and extend, for example, in a row direction. The data output lines VSL are wiring that outputs the pixel signal output from each readout circuit 12 to the logic circuit 20, and extend, for example, in a column direction.

As depicted in FIG. 2, the logic circuit 20 includes, for example, a vertical drive circuit 21, a column signal processing circuit 22, a horizontal drive circuit 23, and a system control circuit 24. The logic circuit 20 (specifically, the horizontal drive circuit 23) provides image data to an external device by outputting an output voltage for each pixel 11 to the external device.

For example, the vertical drive circuit 21 sequentially selects a plurality of pixels 11 for each predetermined unit of pixel rows. The "predetermined unit of pixel rows" refers to a pixel row in which pixels are selectable with the same address. For example, in a case where one pixel 11 is allocated to one readout circuit 12, the "predetermined unit of pixel rows" refers to one pixel row. Furthermore, for example, in a case where a plurality of pixels 11 shares one readout circuit 12, when the plurality of pixels 11 sharing the readout circuit 12 has a layout of two pixel rows by n pixel columns (n is an integer of 1 or more), the "predetermined unit of pixel rows" refers to two pixel rows. Similarly, when the plurality of pixels 11 sharing the readout circuit 12 has a layout of four pixel rows by n pixel columns (n is an integer of 1 or more), the "predetermined unit of pixel rows" refers to four pixel rows. The vertical drive circuit 21 controls transistors (for example, a first transfer transistor TRX, a second transfer transistor TRG, and a discharge transistor OFG) in each pixel 11 via the pixel drive line HSL, and further controls transistors (for example, a reset transistor RST and a selection transistor SEL) in each readout circuit 12.

The column signal processing circuit 22 performs, for example, correlated double sampling (CDS) processing on the pixel signal output from each pixel 11 in the row selected by the vertical drive circuit 21. The column signal processing circuit 22 extracts a signal level of the pixel signal by performing the CDS processing, for example, and retains pixel data corresponding to the amount of light received by each pixel 11. The column signal processing circuit 22 includes, for example, a column signal processing unit for each data output line VSL. The column signal processing unit includes, for example, a single-slope A/D converter. The single-slope A/D converter includes, for example, a comparator and a counter circuit. The horizontal drive circuit 23 sequentially outputs the pixel data retained in the column signal processing circuit 22 to the outside, for example. The system control circuit 24 controls driving of each block (the vertical drive circuit 21, the column signal processing circuit 22, and the horizontal drive circuit 23) in the logic circuit 20, for example.

FIG. 3 depicts an example of a circuit configuration of the pixel 11 and the readout circuit 12. FIG. 3 illustrates a case where one pixel 11 is allocated to one readout circuit 12. Each pixel 11 have common components. Each pixel 11 includes, for example, a photodiode PD, the first transfer transistor TRX, the second transfer transistor TRG, a memory part MEM, a floating diffusion FD, the discharge transistor OFG, and an overflow drain OFD. The first transfer transistor TRX, the second transfer transistor TRG, and the discharge transistor OFG are field effect transistors such as n-channel conductivity type metal oxide semiconductor field effect transistors (MOSFET). The photodiode PD corresponds to a specific example of a "photoelectric conversion part" of the present technology. The memory part MEM corresponds to a specific example of a "first electric charge retaining part" of the present technology. The floating diffusion FD corresponds to a specific example of a "second electric charge retaining part" of the present technology.

The photodiode PD photoelectrically converts light that has entered through the light receiving surface S1 (to be described later). The photodiode PD generates electric charges corresponding to the amount of received light by photoelectric conversion. The photodiode PD is, for example, a PN-junction type photoelectric conversion element. The photodiode PD has a cathode electrically connected to a source of the first transfer transistor TRX and an anode electrically connected to a reference potential line (for example, ground GND).

As depicted in FIG. 3, the first transfer transistor TRX is connected between the photodiode PD and the second transfer transistor TRG, and controls a potential of the memory part MEM in accordance with a control signal applied to a gate electrode of the first transfer transistor TRX. For example, when the first transfer transistor TRX is turned on, the potential of the memory part MEM becomes deeper. Furthermore, for example, when the first transfer transistor TRX is turned off, the potential of the memory part MEM becomes shallower. When the first transfer transistor TRX is turned on, the electric charges accumulated in the photodiode PD are transferred to the memory part MEM via the first transfer transistor TRX. The first transfer transistor TRX has a drain electrically connected to a source of the second transfer transistor TRG and the gate electrode connected to the pixel drive line HSL.

The memory part MEM is a region where the electric charges accumulated in the photodiode PD are temporarily retained. The memory part MEM retains the electric charges transferred from the photodiode PD.

The second transfer transistor TRG is connected between the first transfer transistor TRX and the floating diffusion FD, and transfers the electric charges retained in the memory part MEM to the floating diffusion FD in accordance with a control signal applied to a gate electrode of the second transfer transistor TRG. For example, when the first transfer transistor TRX is turned off, and the second transfer transistor TRG is turned on, the electric charges retained in the memory part MEM are transferred to the floating diffusion FD via the second transfer transistor TRG. The second transfer transistor TRG has a drain electrically connected to the floating diffusion FD and the gate electrode connected to the pixel drive line HSL.

The floating diffusion FD is a floating diffusion region where the electric charges output from the photodiode PD via the first transfer transistor TRX and the second transfer transistor TRG are temporarily retained. For example, the reset transistor RST is connected to the floating diffusion FD, and the vertical signal line VSL is connected to the floating diffusion FD via an amplification transistor AMP and the selection transistor SEL.

The discharge transistor OFG is connected between the photodiode PD and a power supply line VDD, and initializes (resets) the photodiode PD in accordance with a control signal applied to a gate electrode of the discharge transistor OFG. For example, when the discharge transistor OFG is turned on, a potential of the photodiode PD is reset to a potential level of the power supply line VDD. That is, the photodiode PD is initialized. Furthermore, for example, the discharge transistor OFG forms an overflow path between the first transfer transistor TRX and the power supply line VDD, and discharges electric charges overflowing from the photodiode PD to the power supply line VDD. The discharge transistor OFG has a drain connected to the power supply line VDD, a source connected between the photodiode PD and the first transfer transistor TRX, and the gate connected to the pixel drive line HSL.

The reset transistor RST is connected between the floating diffusion FD and the power supply line VDD, and initializes (resets) each region from the memory part MEM to the floating diffusion FD in accordance with a control signal applied to a gate electrode of the reset transistor RST. For example, when the second transfer transistor TRG and the reset transistor RST are turned on, the potentials of the memory part MEM and the floating diffusion FD are reset to the potential level of the power supply line VDD. That is, the memory part MEM and the floating diffusion FD are initialized. The reset transistor RST has a drain connected to the power supply line VDD, a source connected to the floating diffusion FD, and the gate electrode connected to the pixel drive line HSL.

The amplification transistor AMP has a gate connected to the floating diffusion FD, a drain connected to the power supply line VDD, and a source connected to a drain of the selection transistor SEL. The amplification transistor AMP serves as an input part of a source follower circuit that reads out electric charges obtained by photoelectric conversion in the photodiode PD. The amplification transistor AMP has the source connected to the vertical signal line VSL via the selection transistor SEL, so that the amplification transistor AMP constitutes the source follower circuit together with a constant current source connected to one end of the vertical signal line VSL. The amplification transistor AMP converts the electric charges obtained by photoelectric conversion in the photodiode PD into a pixel signal and outputs the pixel signal to the vertical signal line VSL via the selection transistor SEL.

The selection transistor SEL has the drain connected to the source of the amplification transistor AMP, a source connected to the vertical signal line VSL, and a gate electrode connected to the pixel drive line HSL. The selection transistor SEL controls the output of the pixel signal output from the amplification transistor AMP to the vertical signal line VSL in accordance with a control signal applied to the gate electrode of the selection transistor SEL. When the control signal is turned to ON, the selection transistor SEL is brought into conduction, and the pixel 11 coupled to the selection transistor SEL is brought into a selected state. When the pixel 11 is brought into the selected state, the pixel signal output from the amplification transistor AMP is read out by the column signal processing circuit 22 via the vertical signal line VSL.

<Pixel>

Figure 4A:
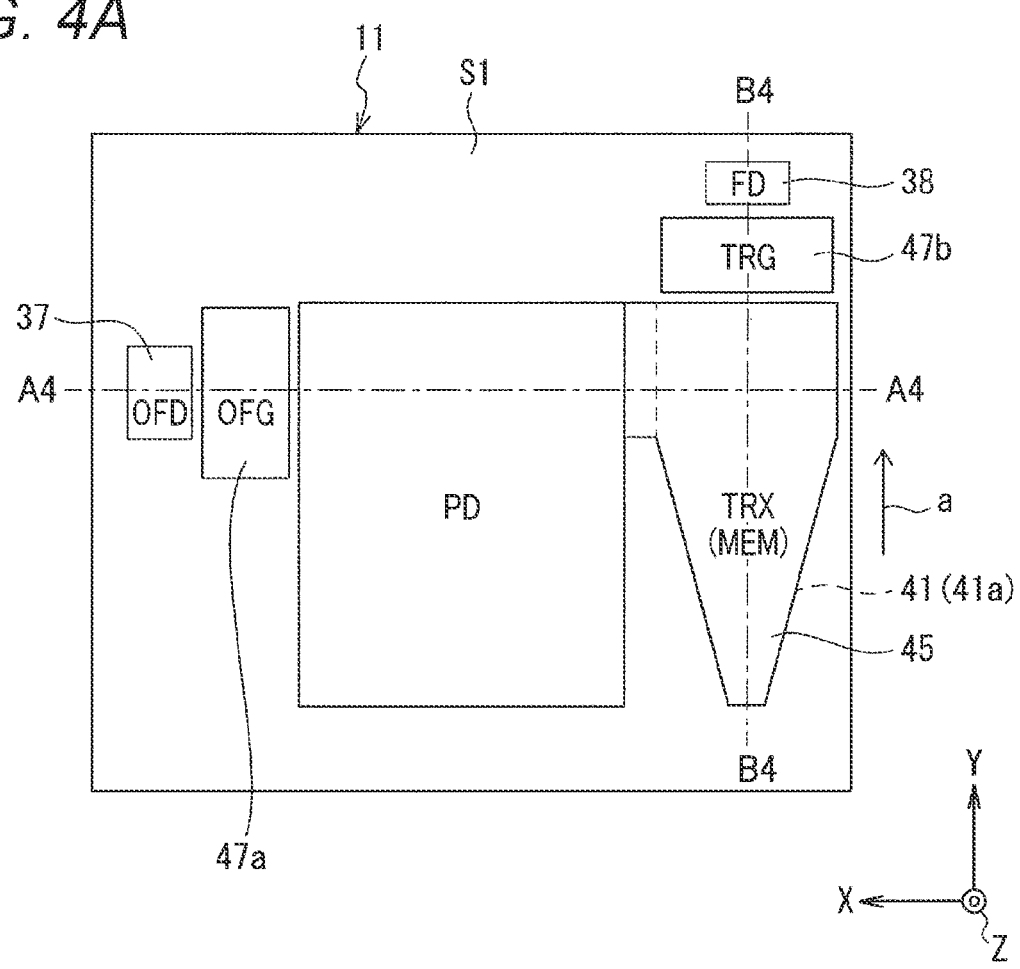
FIG. 4A is a plan view schematically depicting a planar configuration example of the pixel in FIG. 2.
Figure 4B:
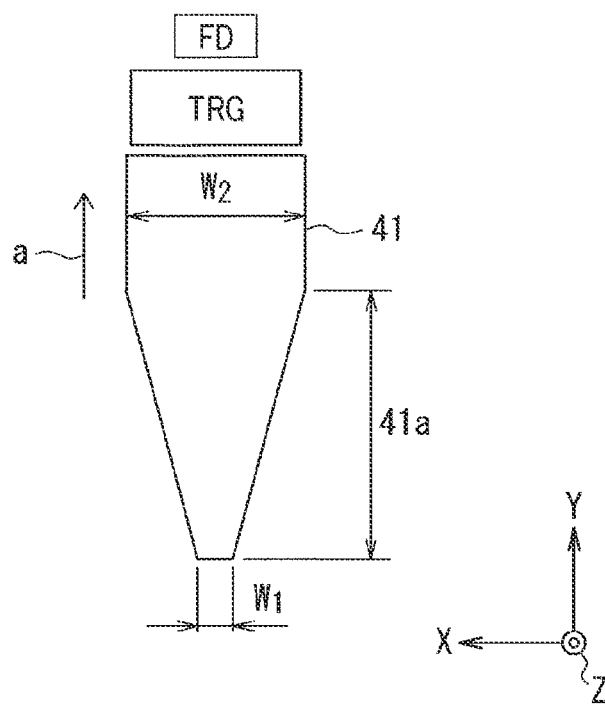
FIG. 4B is a diagram depicting a planar pattern of a semiconductor region included in a memory part in FIG. 4A.
Figure 5A:
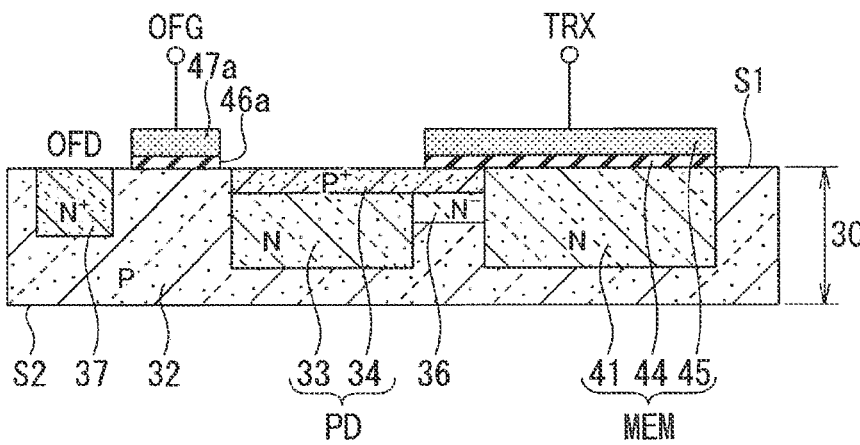
FIG. 5A is a cross-sectional view schematically depicting a cross-sectional structure taken along a line A4-A4 in FIG. 4A.
Figure 5B:
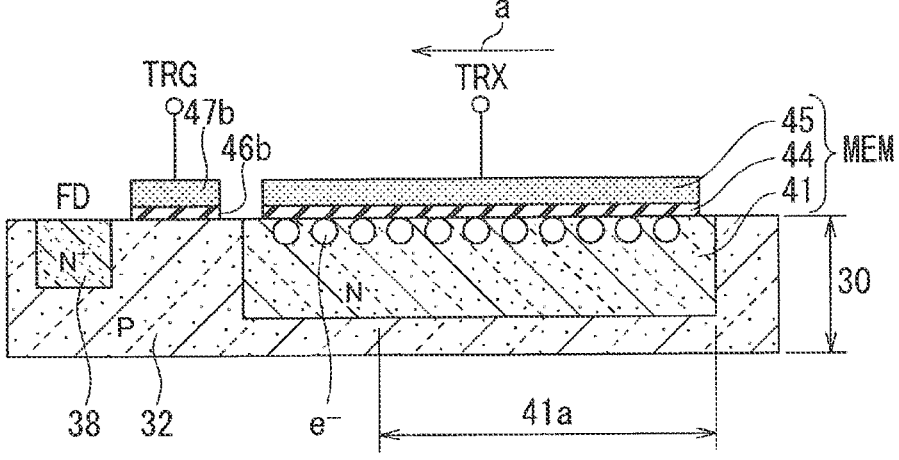
FIG. 5B is a cross-sectional view schematically depicting a cross-sectional structure taken along a line B4-B4 in FIG. 4A.

Next, a configuration of the pixel 11 will be described in detail. FIG. 4A is a plan view schematically depicting a planar configuration example of the pixel 11. FIG. 4B is a diagram depicting a planar pattern of a semiconductor region 41 included in the memory part in FIG. 4A. FIG. 5A is a cross-sectional view schematically depicting a cross-sectional structure taken along a line A4-A4 in FIG. 4A. FIG. 5B is a cross-sectional view schematically depicting a cross-sectional structure taken along a line B4-B4 in FIG. 4A.

FIGS. 4A, 4B, 5A, and 5B are schematic diagrams, and are not necessarily strict illustrations. In FIGS. 5A and 5B, impurity concentrations are indicated by "P+", "P", "P−", "N+", "N", and "N−". Here, "P+" indicates that the concentration of the p-type impurity (acceptor) is higher than "P", and "P−" indicates that the concentration of the p-type impurity (acceptor) is lower than "P". Furthermore, "N+" indicates that the concentration of the n-type impurity (donor) is higher than "N", and "N−" indicates that the concentration of the n-type impurity (donor) is lower than "N".

As depicted in FIG. 4A, the pixel 11 has a rectangular planar shape. Then, the pixel 11 includes, in a rectangular region, the photodiode PD, the first transfer transistor TRX, the memory part MEM, the second transfer transistor TRG, and the floating diffusion FD described above, and further includes the discharge transistor OFG and the overflow drain OFD described above.

As depicted in FIGS. 4A and 5A, the overflow drain OFD, the discharge transistor OFG, the photodiode PD, the first transfer transistor TRX, and the memory part MEM are arranged in this order in the X direction.

As depicted in FIGS. 4A and 5B, the memory part MEM, the second transfer transistor TRG, and the floating diffusion FD are arranged in this order in the Y direction.

Here, when the first transfer transistor TRX is turned off, and the second transfer transistor TRG is turned on, signal electric charges retained in the memory part MEM are transferred to the floating diffusion FD via the second transfer transistor TRG. A direction in which the signal electric charges are transferred in the memory part MEM at this time, specifically, a direction in which the signal electric charges are transferred in the semiconductor region 41 included in the memory part MEM is indicated by an arrow a in FIGS. 4A, 4B, 5B, and 5C. Then, the arrow a may be referred to as a signal electric charge transfer direction a.

The pixel 11 is formed in the semiconductor layer 30 depicted in FIG. 5A. The semiconductor layer 30 is, for example, a silicon substrate. As depicted in FIG. 5A, the semiconductor layer 30 has a p-type well region 32 extending in a depth direction from a first surface S1 of the semiconductor layer 30, and has, although not depicted, an n-type semiconductor layer located deeper than the p-type well region 32. The p-type well region 32 is a p-type semiconductor region.

As depicted in FIG. 5A, an n-type semiconductor region 33 and a p-type semiconductor region 34 are provided in the p-type well region 32. The p-type semiconductor region 34 is provided in a surface layer portion of the semiconductor layer 30 adjacent to the first surface S1. The n-type semiconductor region 33 is provided at a position deeper than the p-type semiconductor region 34, and is in contact with the p-type semiconductor region 34 to form a pn junction. The n-type semiconductor region 33 and the p-type semiconductor region 34 are stacked in the thickness direction (Z direction) of the semiconductor layer 30, and constitute the photodiode PD as the photoelectric conversion part. Of the first surface S1 of the semiconductor layer 30, a formation region of the p-type semiconductor region 34 serves as the light receiving surface. The p-type semiconductor region 34 is higher in impurity concentration than the p-type well region 32. Here, the description has been given on the basis of a front-illuminated type, but the present technology is applicable not only to a front-illuminated type but also to a back-illuminated type.

As depicted in FIG. 5A, the overflow drain OFD includes an n-type semiconductor region 37 provided in the surface layer portion of the semiconductor layer 30 adjacent to the first surface S1.

As depicted in FIG. 5A, the discharge transistor OFG includes a gate insulation film 46a provided on the first surface S1 of the semiconductor layer 30, and a gate electrode 47a provided on the first surface S1 of the semiconductor layer 30 with the gate insulation film 46a interposed between the gate electrode 47a and the semiconductor layer 30. Furthermore, the discharge transistor OFG includes the photodiode PD (photoelectric conversion part) functioning as a source region and the overflow drain OFD functioning as a drain region. Then, the discharge transistor OFG uses the p-type well region 32 immediately below the gate electrode 47a as a channel formation region, and electrically connects the source region and the drain region via a channel (conduction path) formed in the channel formation region.

As depicted in FIG. 5A, the first transfer transistor TRX includes an insulation film 44 provided on the first surface S1 of the semiconductor layer 30 and functioning as a gate insulation film, and an electrode 45 provided on the first surface S1 of the semiconductor layer 30 with the insulation film 44 interposed between the electrode 45 and the semiconductor layer 30 and functioning as a gate electrode. Furthermore, the first transfer transistor TRX includes the photodiode PD (photoelectric conversion part) functioning as a source region and the n-type semiconductor region 41 functioning as a drain region. Then, the first transfer transistor TRX uses an n-type semiconductor region 36 immediately below the gate electrode (electrode 45) as a channel formation region, and electrically connects the source region and the drain region via a channel (conduction path) formed in the channel formation region.

As depicted in FIG. 5A, the memory part MEM includes the n-type semiconductor region 41 provided in the surface layer portion of the semiconductor layer 30 adjacent to the first surface S1, and the electrode 45 placed on the n-type semiconductor region 41 with the insulation film 44 interposed between the electrode 45 and the n-type semiconductor region 41. That is, the memory part MEM includes a capacitive element having a metal oxide semiconductor (MOS) structure. The n-type semiconductor region 41 is a floating diffusion region where the signal electric charges transferred from the photodiode PD via the first transfer transistor TRX are temporarily retained. The insulation film 44 functions as a dielectric film. The insulation film 44 includes, for example, a silicon oxide ($SiO_2$) film. As the insulation film 44, for example, a silicon nitride ($Si_3N_4$) film or a laminated film of, for example, a silicon nitride film and a silicon oxide film may be used.

The n-type semiconductor region 41 is provided adjacent to the p-type semiconductor region 34 in the X direction, and is in contact with the p-type semiconductor region 34 to form a pn junction. Furthermore, the n-type semiconductor region 41 is separated from the n-type semiconductor region 33. Then, the n-type semiconductor region 36 lower in impurity concentration than the n-type semiconductor region 41 and the n-type semiconductor region 33 is provided between the n-type semiconductor region 41 and the n-type semiconductor region 33. The n-type semiconductor region 36 is electrically connected to the n-type semiconductor regions 41 and 33, and is in contact with the p-type semiconductor region 34 immediately below the electrode 45 to form a pn junction. The n-type semiconductor region 36 is lower in impurity concentration than the n-type semiconductor regions 41 and 33.

As depicted in FIG. 5B, the floating diffusion FD includes an n-type semiconductor region 38 provided in the surface layer portion of the semiconductor layer 30 adjacent to the first surface S1.

As depicted in FIG. 5B, the second transfer transistor TRG includes a gate insulation film 46b provided on the first surface S1 of the semiconductor layer 30, and a gate electrode 47b provided on the first surface S1 of the semiconductor layer 30 with the gate insulation film 46b interposed between the gate electrode 47b and the semiconductor layer 30. Furthermore, the second transfer transistor TRG includes the n-type semiconductor region 41 functioning as a source region and the floating diffusion FD functioning as a drain region. Then, the second transfer transistor TRG uses the p-type well region 32 immediately below the gate electrode 47b as a channel formation region, and electrically connects the source region and the drain region via a channel (conduction path) formed in the channel formation region.

The memory part MEM and the first transfer transistor TRX share the electrode 45 and the insulation film 44. That is, the electrode 45 of the memory part MEM is integrated with the gate electrode 45 of the first transistor TRX. Here, the electrode 45 and the insulation film 44 of the first transfer transistor TRX may be referred to as the gate electrode 45 and a gate insulation film 44, respectively.

Although not illustrated, as will be described with reference to FIG. 5A, a first potential barrier is formed between the photodiode PD and the memory part MEM. The first potential barrier is formed by the p-type semiconductor region 34 and the n-type semiconductor region 36 immediately below the electrode 45. A height (potential $\varphi x$) of the first potential barrier is lower than a height (potential $\varphi_{TRG}$, $\varphi_{OFG}$) of a second potential barrier.

The second potential barrier is formed by the p-type well region 32 formed around a region including the memory part MEM and the first potential barrier. Although not illustrated, as will be described with reference to FIG. 5B, the potential $\varphi_{TRG}$ of a portion where the p-type well region 32 faces the gate electrode 47b of the second transfer transistor TRG and the potential $\varphi_{OFG}$ of a portion where the p-type well region 32 faces the discharge transistor OFG are equal to the potential $\varphi x$ of the n-type semiconductor region 36. The potential $\varphi_{TRG}$ and the potential $\varphi_{OFG}$ may be equal to each other or different from each other.

Although not illustrated, as will be described with reference to FIG. 5A, the first transfer transistor TRX controls the height (potential $\varphi x$) of the first potential barrier in accordance with the control signal applied to the gate electrode 45 of the first transfer transistor TRX. For example, when the first transfer transistor TRX is turned on, the height (potential $\varphi x$) of the first potential barrier becomes deeper. Furthermore, for example, in a case where the first transfer transistor TRX is turned off, and a negative bias is applied to the gate electrode of the first transfer transistor TRX, the height (potential $\varphi x$) of the first potential barrier becomes shallow as compared with a case where no negative bias is applied to the gate electrode 45 of the first transfer transistor TRX. At this time, a difference between the height (potential $\varphi x$) of the first potential barrier and the height (potential $\varphi_{TRG}$, $\varphi_{OFG}$) of the second potential barrier becomes small as compared with a case where no negative bias is applied to the gate electrode 45 of the first transfer transistor TRX.

<Configuration of Memory Part>

As depicted in FIG. 4A, the memory part MEM has a band shape extending in the Y direction and having a length in the Y direction longer than a width in the X direction. Then, as depicted in FIGS. 5A and 5B, the n-type semiconductor region 41 provided in the surface layer portion of the semiconductor layer 30 adjacent to the first surface S1, and the electrode 45 placed on the n-type semiconductor region 41 with the insulation film 44 interposed between the electrode 45 and the n-type semiconductor region 41 are included.

As depicted in FIG. 4B, the n-type semiconductor region 41 included in the memory part MEM has a width $W_1$ of an upstream side in the signal electric charge transfer direction a in the semiconductor region 41 smaller than a width $W_2$ of a downstream side. In other words, the width $W_1$ of a side of the n-type semiconductor region 41 remote from the floating diffusion FD is smaller than the width $W_2$ of a side adjacent to the floating diffusion FD. Then, in the first embodiment, the n-type semiconductor region 41 includes a narrow portion 41a that becomes narrower with an increase in distance from the floating diffusion FD. The narrow portion 41a of this embodiment becomes gradually narrower with an increase in distance from the floating diffusion FD.

As depicted in FIGS. 4A and 4B, the n-type semiconductor region 41 is similar in planar shape to the electrode 45. Furthermore, although not illustrated in detail, the insulation film 44 interposed between the n-type semiconductor region 41 and the electrode 45 is also similar in planar shape to the electrode 45. A capacitance added to the memory part MEM is proportional to an area of an overlapping region where the n-type semiconductor region 41 and the electrode 45 overlap, so that the n-type semiconductor region 41 and the electrode 45 preferably have the same size and the same planar shape.

Effects of First Embodiment

Figure 6A:
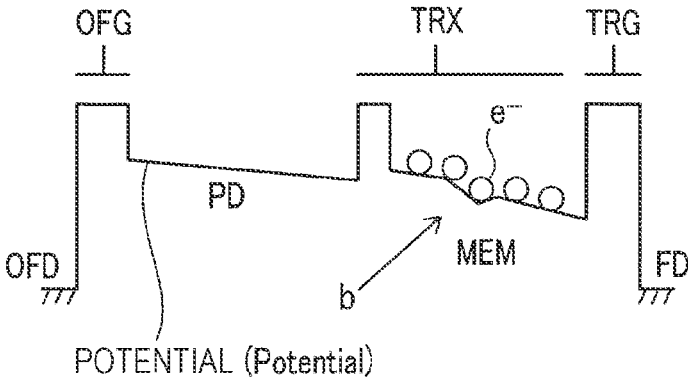
FIG. 6A is a diagram depicting a potential when accumulation is made in a memory part of a pixel of a comparative example.
Figure 6B:
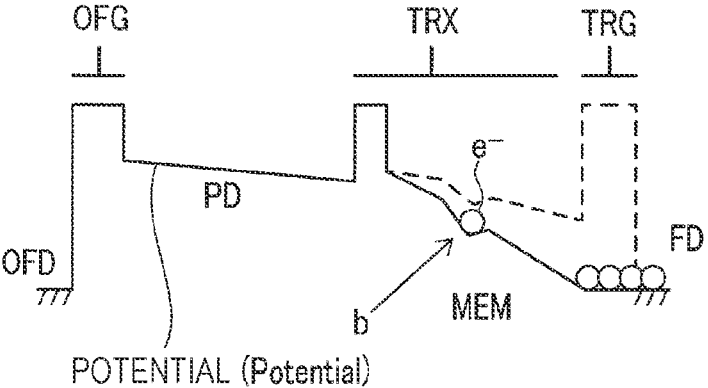
FIG. 6B is a diagram depicting a potential when transfer is made from the memory part of the pixel of the comparative example.

Next, main effects of the first embodiment will be described with reference to a comparative example depicted in FIGS. 6A and 6B. FIG. 6A is a diagram depicting an example of a potential when electric charges are retained (when electric charges are accumulated) in a memory part of a pixel of the comparative example. FIG. 6B is a diagram depicting an example of a potential when transfer is made from the memory part of the pixel of the comparative example.

In the pixel of the comparative example depicted in FIGS. 6A and 6B, controlling the height of the potential barrier ox present between the photodiode PD and the memory part MEM allows the memory part MEM to accumulate the signal electric charges generated by photoelectric conversion in the photodiode PD. In such a pixel, when an impurity concentration gradient is formed in the memory part MEM, a potential gradient from the memory part MEM toward the floating diffusion FD is formed. In a case where the impurity concentration gradient of the memory part MEM is not properly formed, however, unevenness in potential b as depicted in FIG. 6A develops. Then, as depicted in FIG. 6B, when the signal electric charges are transferred, signal electric charges ($e^-$) remain in the unevenness in potential b, and thus, there is a possibility that the signal electric charges cannot be reliably transferred.

Figure 5C:
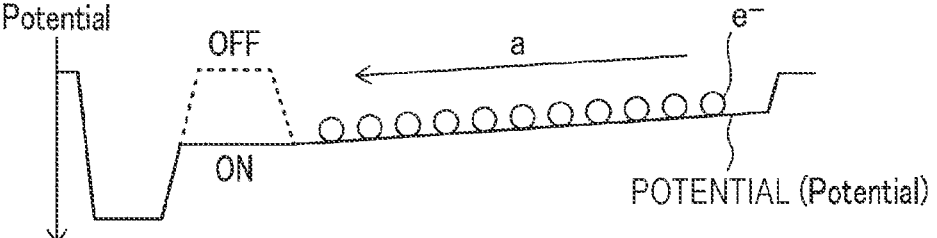
FIG. 5C is a diagram depicting an example of a potential taken along the line B4-B4 in FIG. 4A.

On the other hand, as depicted in FIGS. 4A, 4B, 5A, and 5B, the n-type semiconductor region 41 included in the memory part MEM of the first embodiment has the width W1 of the upstream side in the signal electric charge transfer direction a in the semiconductor region 41 smaller than the width W2 of the downstream side. Then, in this embodiment, the n-type semiconductor region 41 includes the narrow portion 41a that becomes gradually narrower with an increase in distance from the floating diffusion FD. As a result, a narrow channel effect brought about by the narrow n-type semiconductor region 41 causes the potential under the n-type semiconductor region 41 to be influenced by the potential of the surrounding p-type well region 32 and become a high potential for the signal electric charges (electrons e-). The use of this phenomenon makes it possible to form a potential gradient toward the floating diffusion FD without forming the impurity concentration gradient. With this configuration, a potential that facilitates natural transfer to the floating diffusion FD is formed as depicted in FIG. 5C while avoiding the development of the unevenness in potential b (see FIG. 6A) caused by the fact that the impurity concentration gradient is not properly formed, so that it is possible to reliably transfer the signal electric charges (electron e-) in a conveyance direction a.

Furthermore, the signal electric charges can be reliably transferred, so that it is possible to prevent a residual image from developing due to residual signal electric charges and is thus possible to provide a clearer image.

Second Embodiment

Figures 7A, 7B:
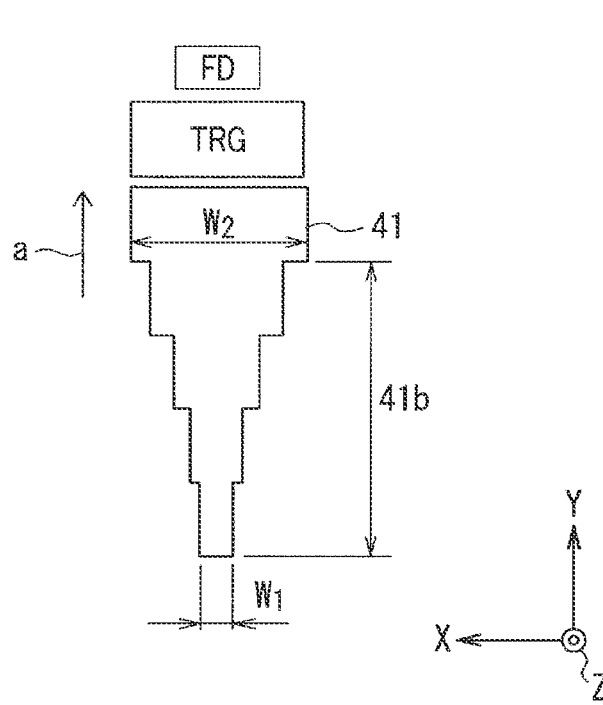
FIG. 7A is a plan view schematically depicting a planar configuration example of a pixel of a solid-state imaging device according to a second embodiment of the present technology.
FIG. 7B is a diagram depicting a planar pattern of a semiconductor region included in a memory part in FIG. 7A.

A solid-state imaging device according to a second embodiment of the present technology is basically similar in configuration to the solid-state imaging device 1A according to the first embodiment described above, but is different in the planar shape of the semiconductor region 41 included in the memory part MEM in FIG. 7A.

That is, as depicted in FIGS. 7A and 7B, the semiconductor region 41 of the second embodiment includes a narrow portion 41b instead of the narrow portion 41a depicted in FIG. 4A of the first embodiment described above. The other configuration is similar to the configuration of the first embodiment described above.

As depicted in FIG. 7B, the narrow portion 41b included in the n-type semiconductor region 41 becomes narrower stepwise (in a stepped manner) with an increase in distance from the floating diffusion FD. In other words, the narrow portion 41b becomes narrower stepwise from the downstream side (side adjacent to the floating diffusion FD) toward the upstream side in the electric charge transfer direction a in the semiconductor region 41.

Also in the solid-state imaging device according to the second embodiment, in a manner similar to the solid-state imaging device 1A according to the first embodiment described above, the signal electric charges can be reliably transferred by virtue of the narrow channel effect.

Furthermore, the signal electric charges can be reliably transferred, so that it is possible to prevent the development of a residual image and is thus possible to provide a clearer image.

Note that, also in the second embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Third Embodiment

Figure 8A:
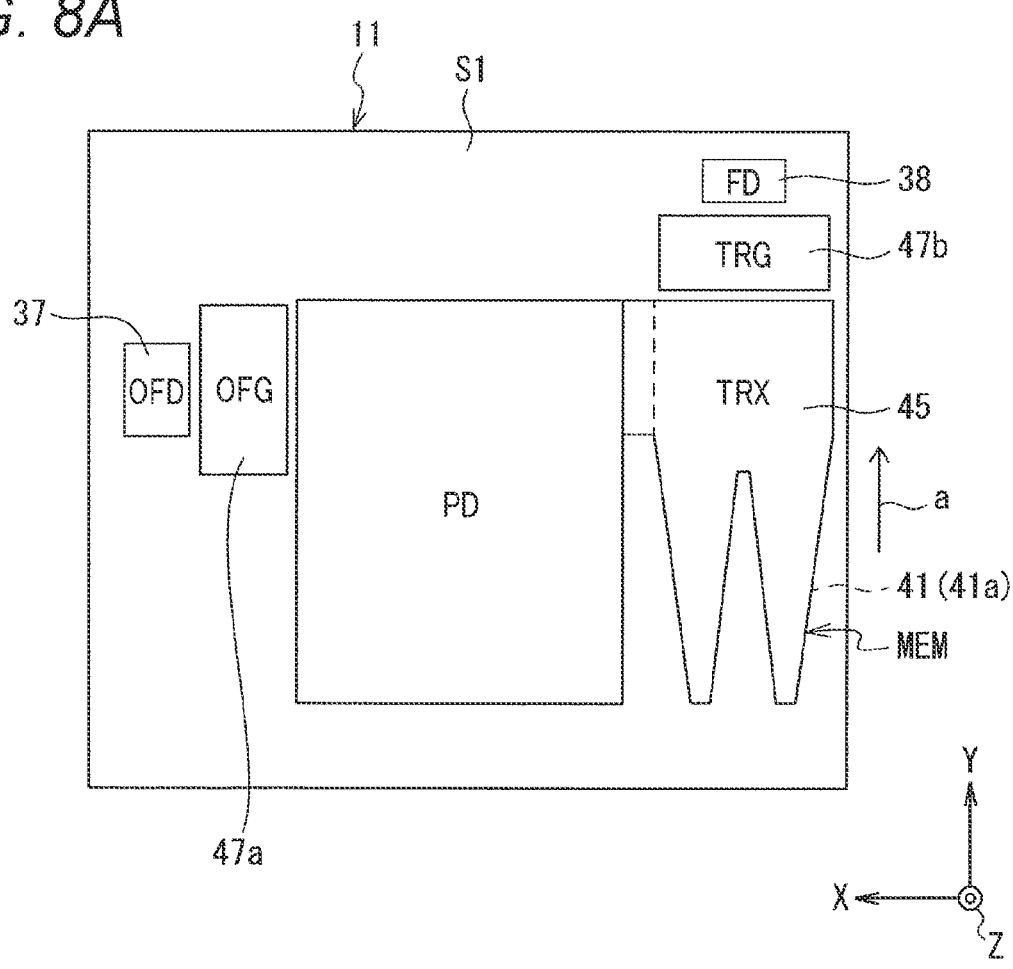
FIG. 8A is a plan view schematically depicting a planar configuration example of a pixel of a solid-state imaging device according to a third embodiment of the present technology.

A solid-state imaging device according to a third embodiment of the present technology is basically similar in configuration to the solid-state imaging device 1A according to the first embodiment described above, but is different in the planar shape of the semiconductor region 41 included in the memory part MEM of the pixel 11 depicted in FIG. 8A.

Figure 8B:
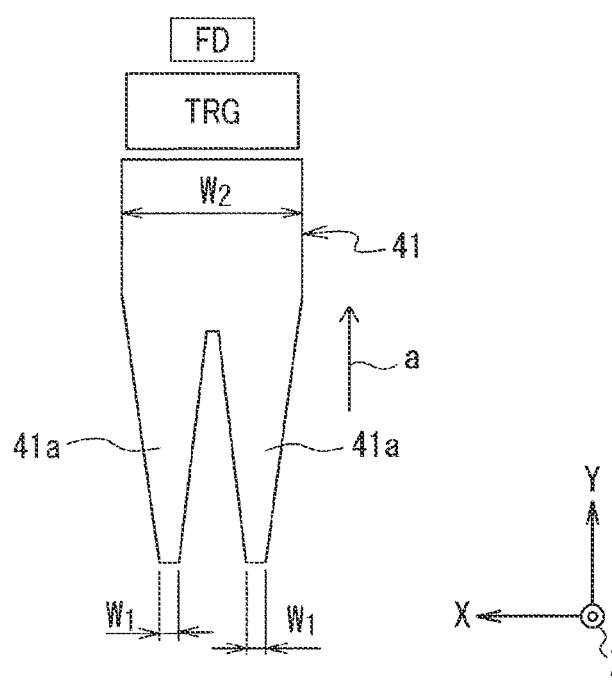
FIG. 8B is a diagram depicting a planar pattern of a semiconductor region included in a memory part in FIG. 8A.

That is, as depicted in FIGS. 8A and 8B, the semiconductor region 41 of the third embodiment includes a plurality of narrow portions 41a arranged side by side in a direction intersecting the electric charge transfer direction a in the semiconductor region 41. In the third embodiment, the semiconductor region 41 includes two narrow portions 41a. The other configuration is similar to the configuration of the first embodiment described above.

Also in the solid-state imaging device according to the third embodiment, in a manner similar to the solid-state imaging device 1 according to the first embodiment described above, the signal electric charges can be reliably transferred by virtue of the narrow channel effect.

Note that, in the third embodiment, the case where two narrow portions 41*a* are provided side by side has been described, but it goes without saying that two or more narrow portions 41*b* may be provided side by side in the second embodiment described above.

Furthermore, also in the third embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Fourth Embodiment

Figure 9:
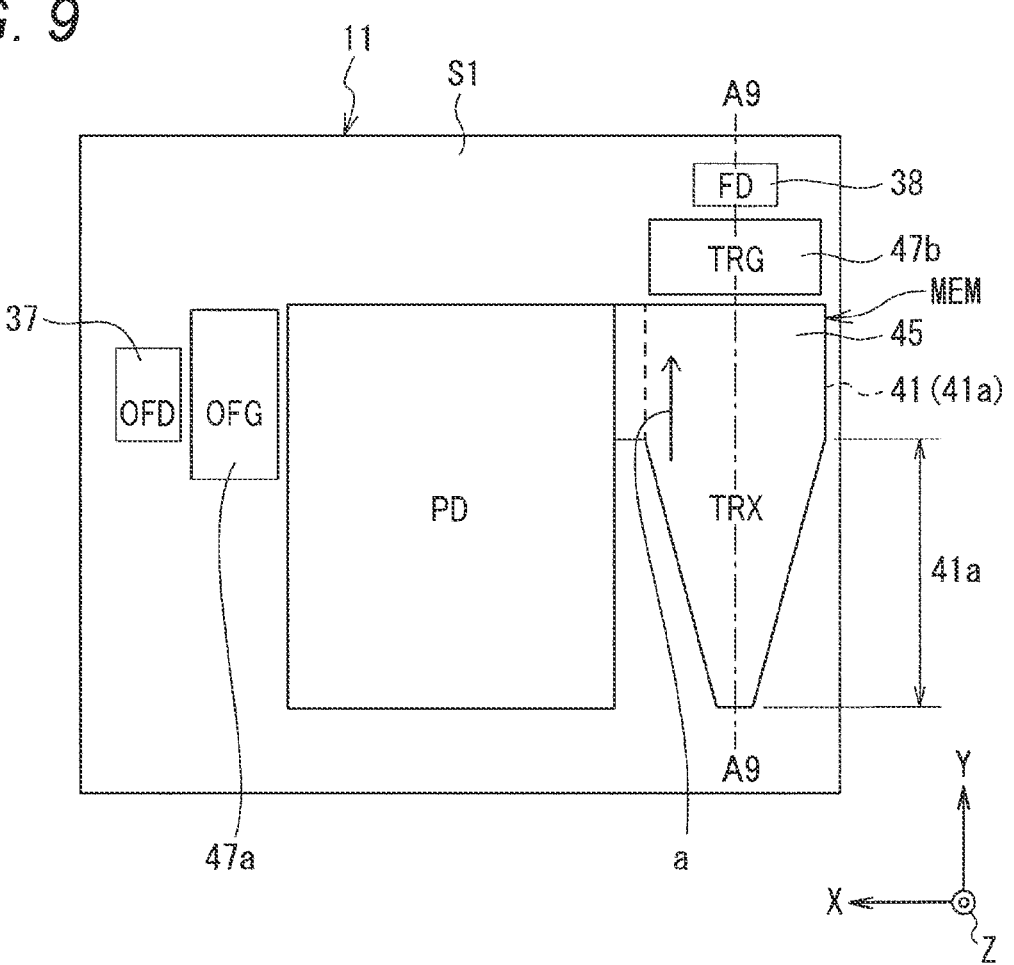
FIG. 9 is a plan view schematically depicting a planar configuration example of a pixel of a solid-state imaging device according to a fourth embodiment of the present technology.

A solid-state imaging device according to a fourth embodiment of the present technology is basically similar in configuration to the solid-state imaging device 1A according to the first embodiment described above, but is different in the configuration of the memory part MEM of the pixel 11 depicted in FIG. 9.

Figure 10:
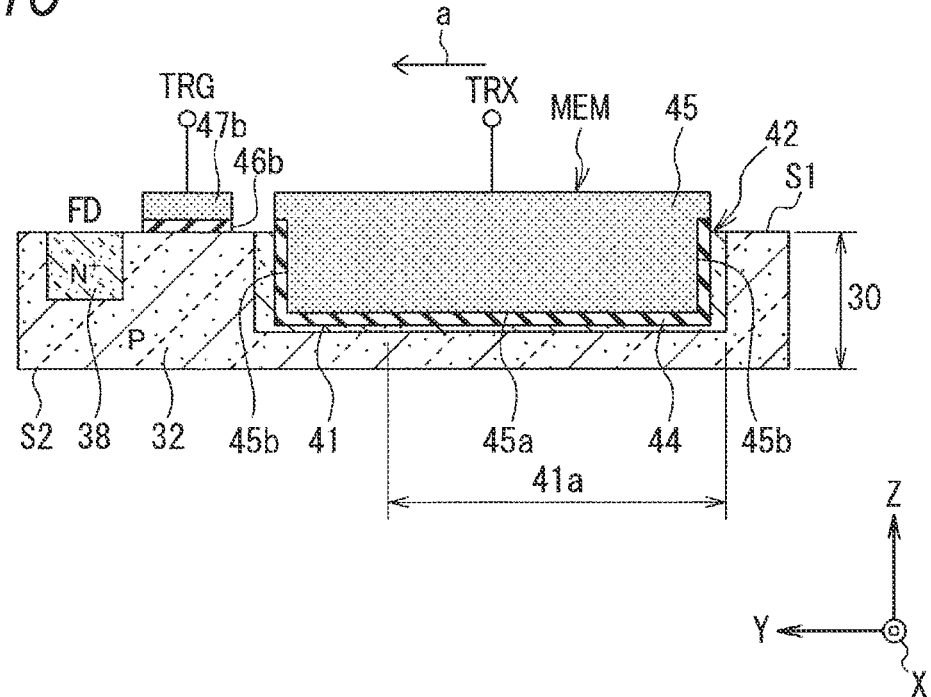
FIG. 10 is a cross-sectional view schematically depicting a cross-sectional structure taken along a line A9-A9 in FIG. 9.

That is, as depicted in FIGS. 9 and 10, the memory part MEM of the fourth embodiment further includes a groove portion 42 provided in the surface layer portion of the semiconductor layer 30 adjacent to the first surface S1. Then, the electrode 45 is provided in the groove portion 42 with the insulation film 44 interposed between the electrode 45 and the groove portion 42. Then, in the groove portion 42, the n-type semiconductor region 41 faces (is adjacent to) a bottom surface 45*a* and a side surface 45*b* of the electrode 45 with the insulation film 44 interposed between the n-type semiconductor region 41 and the electrode 45. In other words, the memory part MEM of the fourth embodiment includes the groove portion 42 provided in the surface layer portion of the semiconductor layer 30 adjacent to the first surface S1, the groove portion 42 extending downward from the first surface S1 of the semiconductor layer 30 in the thickness direction, the n-type semiconductor region 41 provided in the semiconductor layer 30 (p-type well region 32) to face the bottom surface and the side surface (inner wall surface) of the groove portion 42, the insulation film 44 provided along the bottom surface and the side surface (inner wall surface) of the groove portion 42, and the electrode 45 provided in the groove portion 42 with the insulation film 44 interposed between the electrode 45 and the groove portion 42.

Also in the solid-state imaging device according to the fourth embodiment, in a manner similar to the solid-state imaging device 1A according to the first embodiment described above, the signal electric charges can be reliably transferred by virtue of the narrow channel effect.

Furthermore, for the memory part MEM of the fourth embodiment, the capacitance can be increased by an amount corresponding to the area of the insulation film 44 interposed between the n-type semiconductor region 41 and the side surface 45*b* of the electrode 45, so that it is possible to secure a wide dynamic range.

Furthermore, the area of the insulation film 44 is gained in the thickness direction of the semiconductor layer 30, so that it is possible to secure a wide dynamic range without increasing the planar size of the pixel 11.

Note that, also in the fourth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Fifth Embodiment

Figure 11:
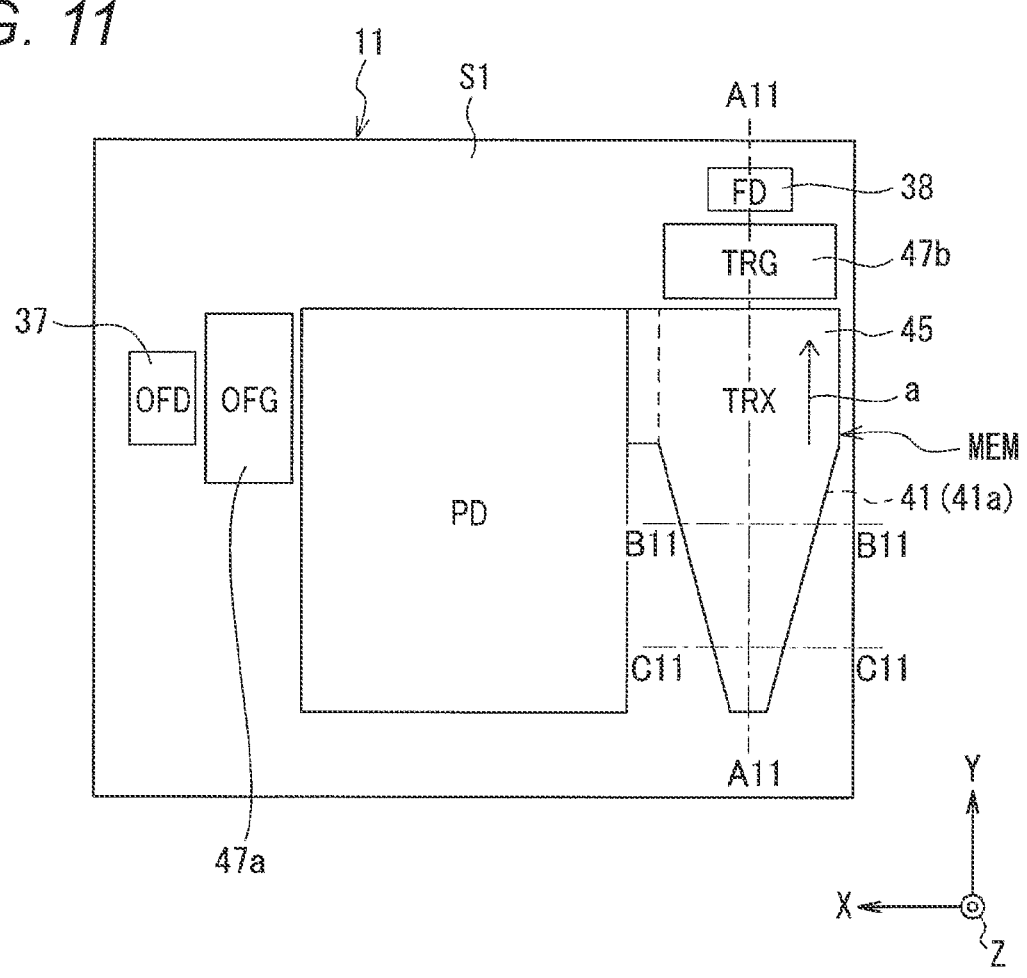
FIG. 11 is a plan view schematically depicting a planar configuration example of a pixel of a solid-state imaging device according to a fifth embodiment of the present technology.

A solid-state imaging device according to a fifth embodiment of the present technology is basically similar in configuration to the solid-state imaging device according to the fourth embodiment described above, but is different in the configuration of the groove portion 42 included in the memory part MEM of the pixel 11 depicted in FIG. 11.

Figure 12A:
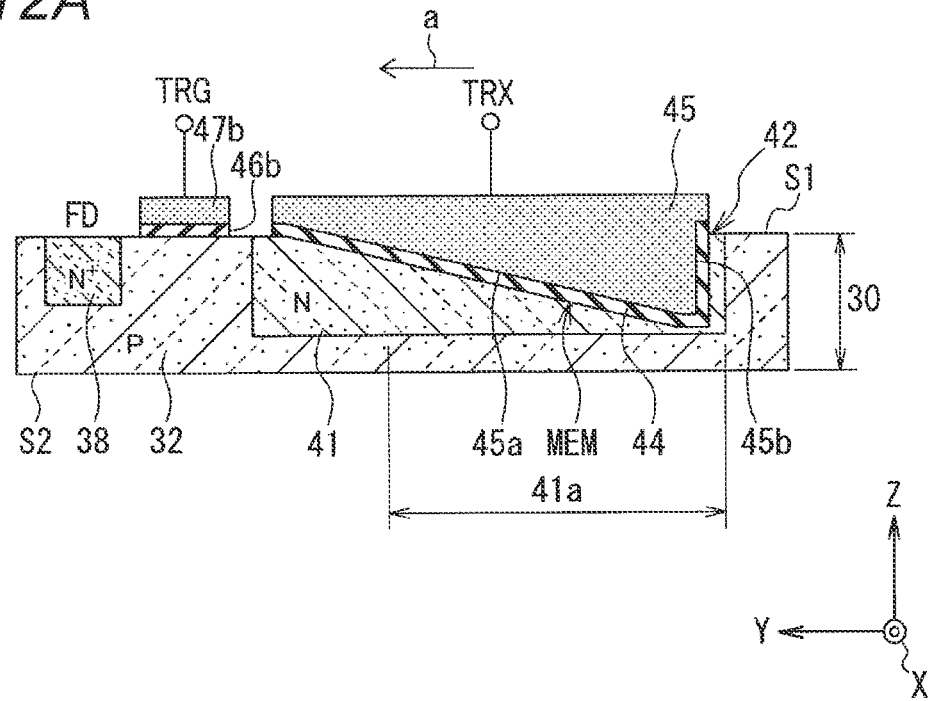
FIG. 12A is a cross-sectional view schematically depicting a cross-sectional structure taken along a line A11-A11 in FIG. 11.
Figure 12B:
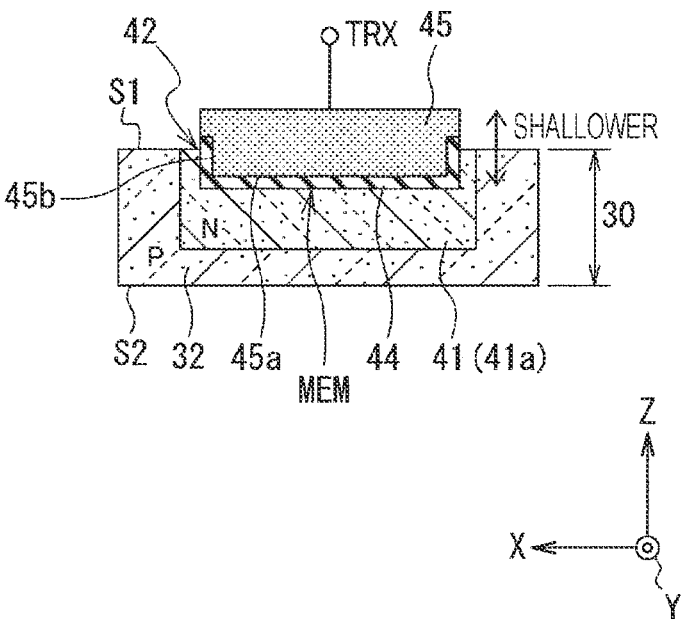
FIG. 12B is a cross-sectional view schematically depicting a cross-sectional structure taken along a line B11-B11 in FIG. 11.
Figure 12C:
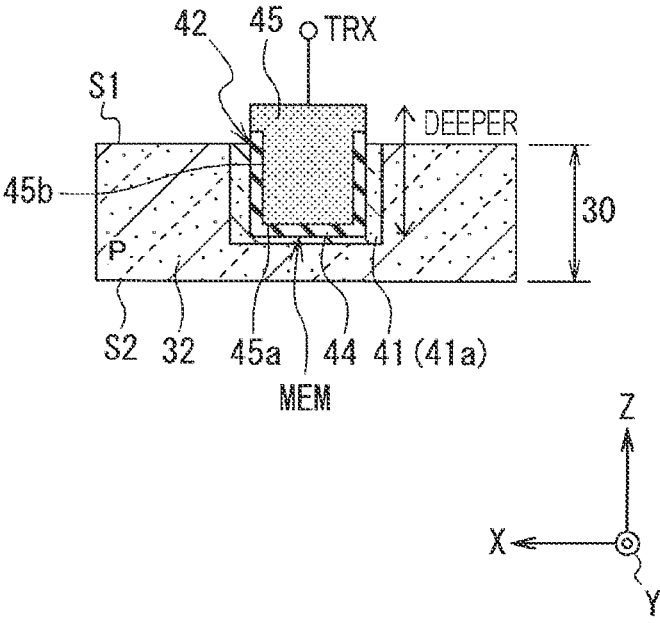
FIG. 12C is a cross-sectional view schematically depicting a cross-sectional structure taken along a line C11-C11 in FIG. 11.

That is, as depicted in FIGS. 12A, 12B, and 12C, the downstream side (side adjacent to the floating diffusion FD) of the groove portion 42 of the fifth embodiment in the signal electric charge transfer direction a in the n-type semiconductor region 41 is shallower than the upstream side of the groove portion 42. In other words, the groove portion 42 becomes shallower as closer to the floating diffusion FD. Then, in the fifth embodiment, the groove portion 42 becomes gradually shallower toward the floating diffusion FD.

Also in the solid-state imaging device according to the fifth embodiment, in a manner similar to the solid-state imaging device 1A according to the first embodiment described above, the signal electric charges can be reliably transferred by virtue of the narrow channel effect.

Furthermore, an electric field direction is directed obliquely upward toward the floating diffusion FD, so that the signal electric charges are easily transferred as compared with the first embodiment described above.

Furthermore, also in the fifth embodiment, the capacitance can be increased by an amount corresponding to the area of the insulation film 44 interposed between the n-type semiconductor region 41 and the side surface 45*b* of the electrode 45, so that it is possible to secure a wide dynamic range.

Note that, also in the fifth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Sixth Embodiment

Figure 13:
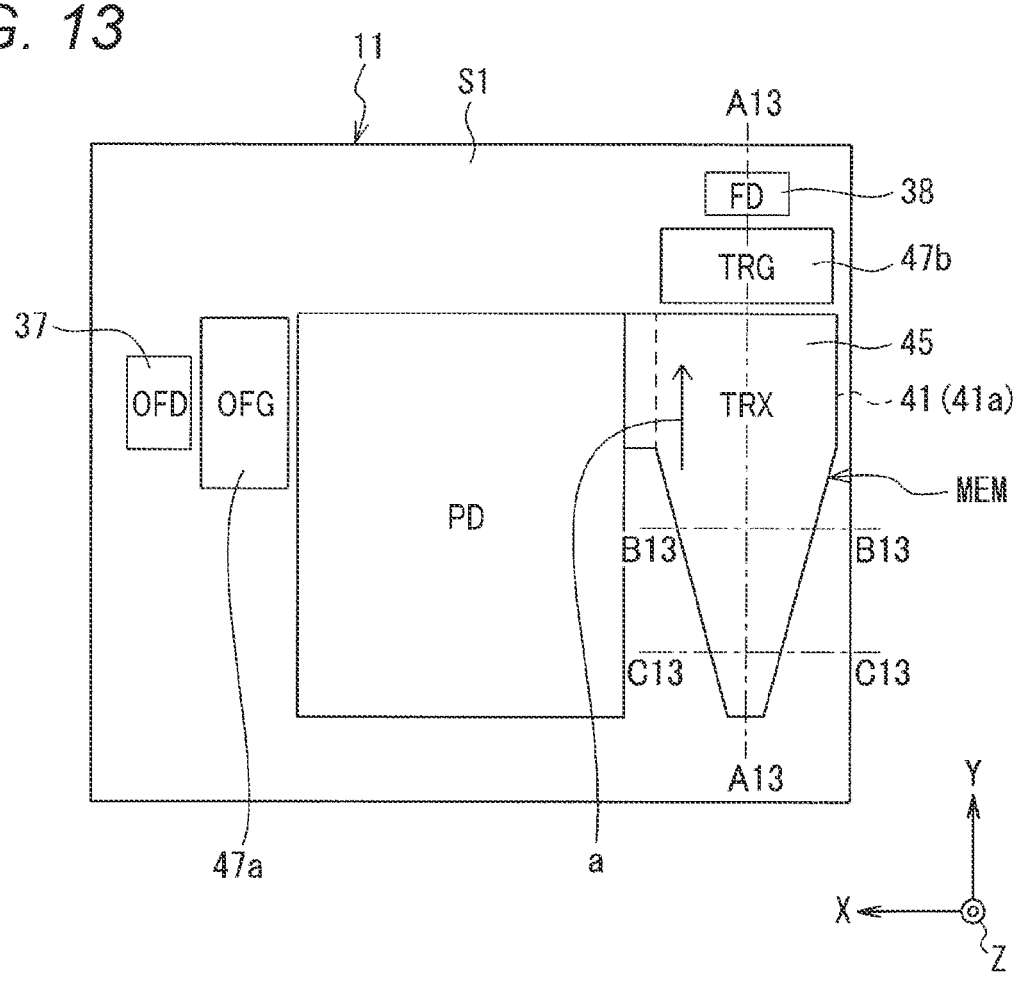
FIG. 13 is a plan view schematically depicting a planar configuration example of a pixel of a solid-state imaging device according to a sixth embodiment of the present technology.

A solid-state imaging device according to a sixth embodiment of the present technology is basically similar in configuration to the solid-state imaging device according to the fifth embodiment described above, but is different in the configuration of the groove portion 42 included in the memory part MEM of the pixel 11 depicted in FIG. 13.

Figure 14A:
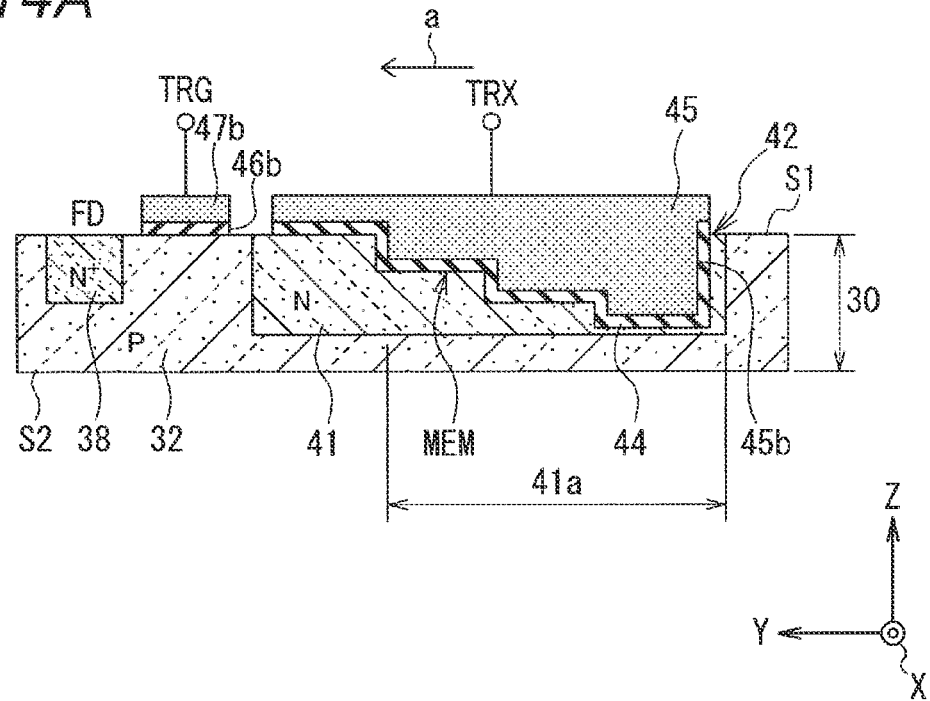
FIG. 14A is a cross-sectional view schematically depicting a cross-sectional structure taken along a line A13-A13 in FIG. 13.
Figure 14B:
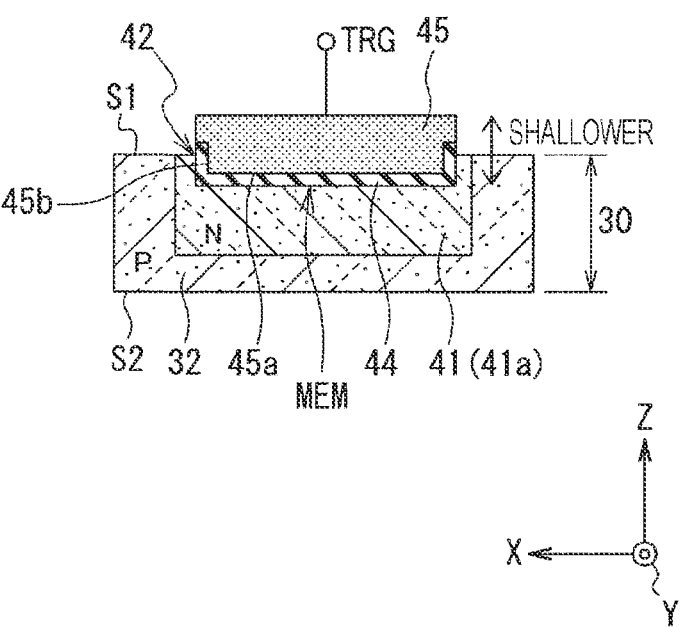
FIG. 14B is a cross-sectional view schematically depicting a cross-sectional structure taken along a line B13-B13 in FIG. 13.
Figure 14C:
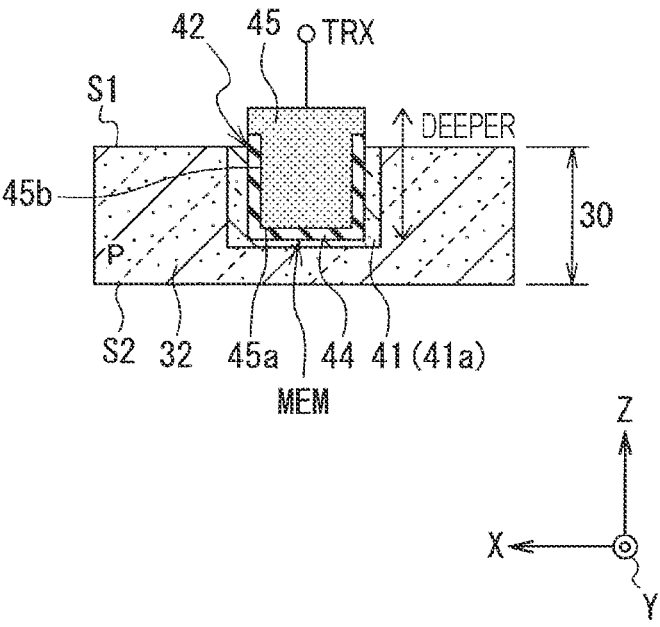
FIG. 14C is a cross-sectional view schematically depicting a cross-sectional structure taken along a line C13-C13 in FIG. 13.

That is, as depicted in FIGS. 14A, 14B, and 14C, the groove portion 42 included in the memory part MEM becomes shallower stepwise (in a stepped manner) from the upstream side (side remote from the floating diffusion FD) toward the downstream side (side adjacent to the floating diffusion FD) in the signal electric charge transfer direction a in the n-type semiconductor region 41. In other words, the groove portion 42 becomes shallower stepwise toward the floating diffusion FD.

Also in the solid-state imaging device according to the sixth embodiment, in a manner similar to the solid-state imaging device 1A according to the first embodiment described above, the signal electric charges can be reliably transferred by virtue of the narrow channel effect.

Furthermore, an electric field direction is directed obliquely upward toward the floating diffusion FD, so that the signal electric charges are easily transferred as compared with the first embodiment described above.

Furthermore, also in the sixth embodiment, the capacitance can be increased by an amount corresponding to the area of the insulation film 44 interposed between the n-type semiconductor region 41 and the side surface 41b of the electrode 45, so that it is possible to secure a wide dynamic range.

Note that, also in the sixth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Seventh Embodiment

Figure 15:
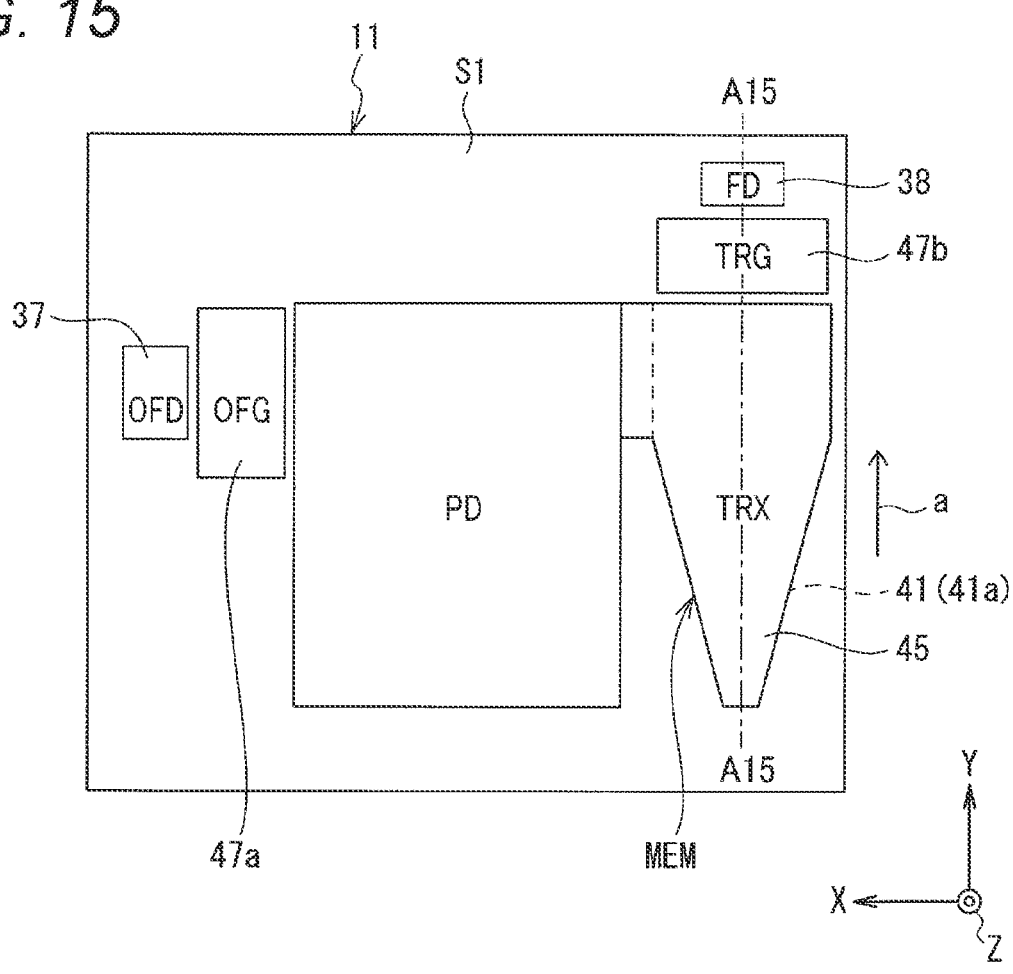
FIG. 15 is a plan view schematically depicting a planar configuration example of a pixel of a solid-state imaging device according to a seventh embodiment of the present technology.

A solid-state imaging device according to a seventh embodiment of the present technology is basically similar in configuration to the solid-state imaging device according to the first embodiment described above, but is different in the configuration of the memory part MEM of the pixel 11 depicted in FIG. 15.

Figure 16:
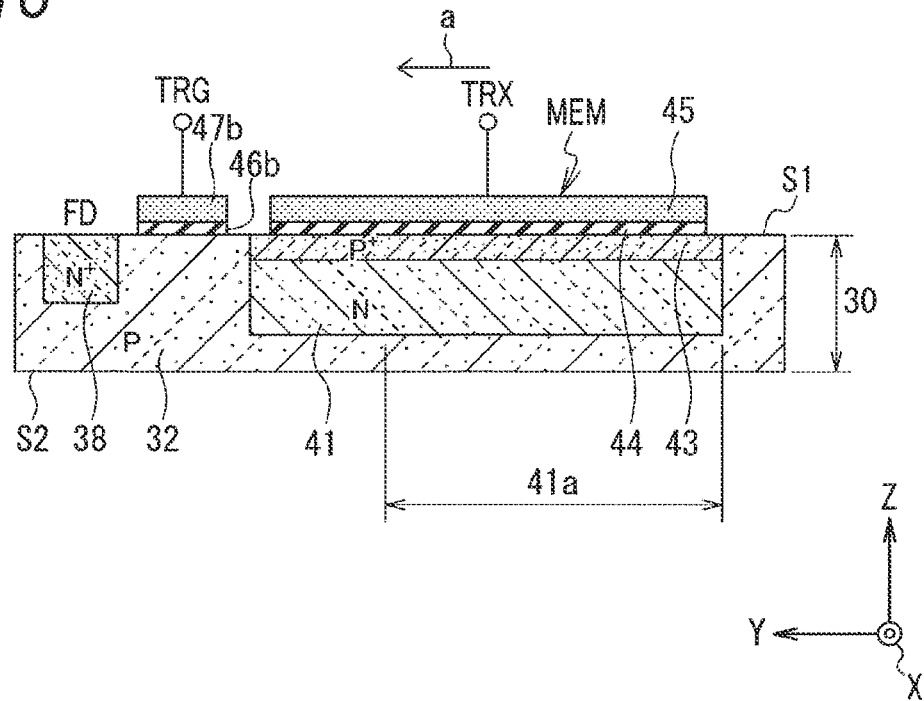
FIG. 16 is a cross-sectional view schematically depicting a cross-sectional structure taken along a line A15-A15 in FIG. 15.

That is, as depicted in FIG. 16, the memory part MEM of the seventh embodiment further includes a pinning layer 43 arranged between the n-type semiconductor region 41 and the insulation film 44. As the pinning layer 43, for example, a p-type semiconductor region higher in impurity concentration can be used.

Also in the solid-state imaging device according to the seventh embodiment, in a manner similar to the solid-state imaging device 1A according to the first embodiment described above, the signal electric charges can be reliably transferred by virtue of the narrow channel effect.

Furthermore, the solid-state imaging device according to the seventh embodiment can prevent the occurrence of dark current at an interface between the semiconductor layer 30 and the insulation film 44 and thus allows a reduction in noise.

Note that, also in the seventh embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Eighth Embodiment

Figure 17:
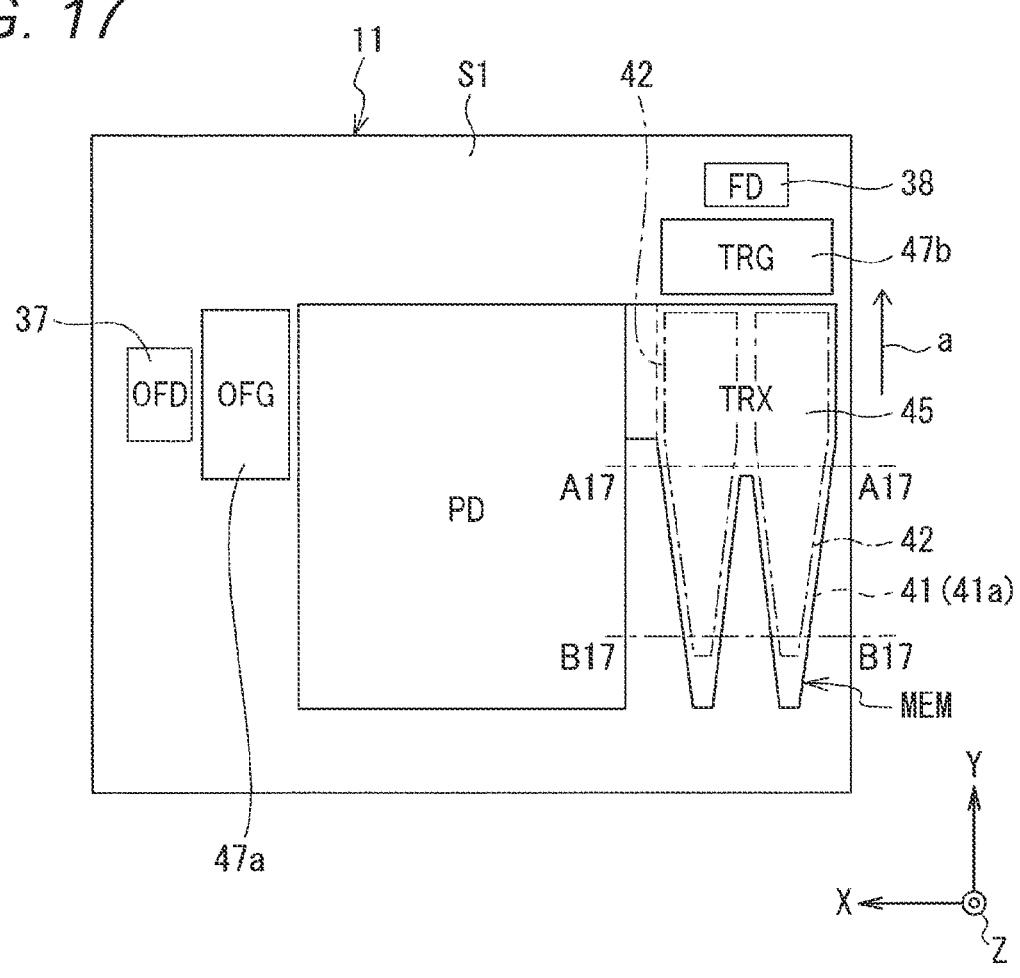
FIG. 17 is a plan view schematically depicting a planar configuration example of a pixel of a solid-state imaging device according to an eighth embodiment of the present technology.

A solid-state imaging device according to an eighth embodiment of the present technology is basically similar in configuration to the solid-state imaging device 1A according to the first embodiment described above, but is different in the configuration of the memory part MEM of the pixel 11 depicted in FIG. 17.

Figure 18A:
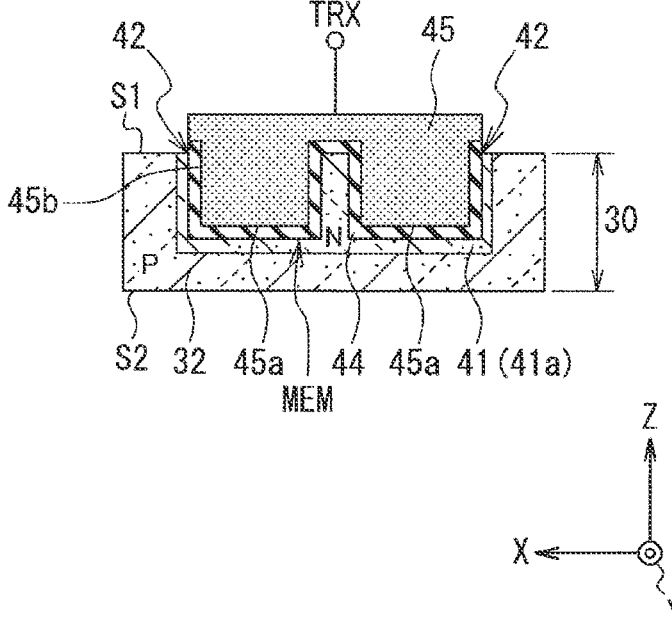
FIG. 18A is a cross-sectional view schematically depicting a cross-sectional structure taken along a line A17-A17 in FIG. 17.
Figure 18B:
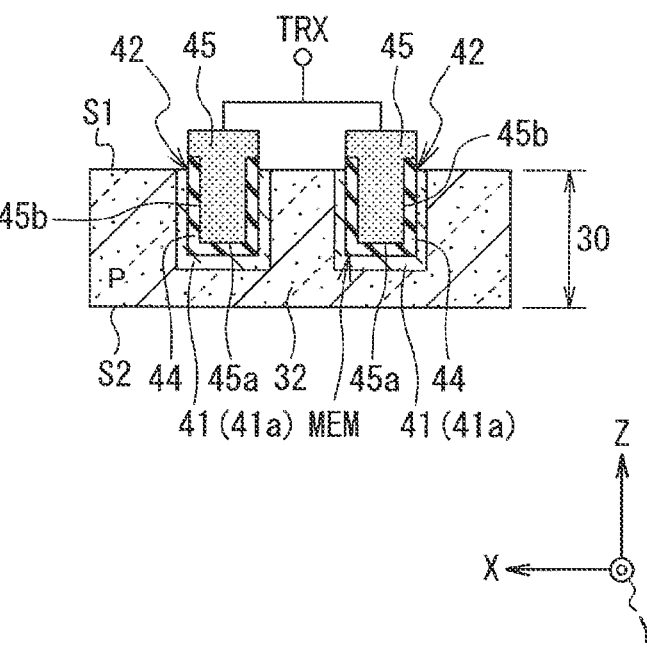
FIG. 18B is a cross-sectional view schematically depicting a cross-sectional structure taken along a line B17-B17 in FIG. 17.

That is, as depicted in FIGS. 17, 18A, and 18B, the memory part MEM of the eighth embodiment has a configuration corresponding to a combination of the narrow portion 41a depicted in FIG. 8A of the third embodiment described above and the groove portion 42 depicted in FIG. 10 of the fourth embodiment described above. Two groove portions 42 are provided corresponding to two narrow portions 41a. Then, in a manner similar to the narrow portion 41a, the two groove portions 42 are arranged side by side in a direction intersecting the signal electric charge transfer direction in the n-type semiconductor region 41 in plan view.

The solid-state imaging device according to the eighth embodiment can also produce effects similar to the effects produced by the solid-state imaging device according to the fourth embodiment described above.

Furthermore, the eighth embodiment is larger in the area of the insulation film 44 interposed between the n-type semiconductor region 41 and the side surface 41b of the electrode 45 than the fourth embodiment, which makes the capacitance larger.

Note that, also in the eighth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Note that two or more of the first to eighth embodiments described above may be combined.

Ninth Embodiment

In a ninth embodiment, an example where the present technology (technology according to the present disclosure) is applied to a ranging sensor will be described as a photodetection device.

Figure 19A:
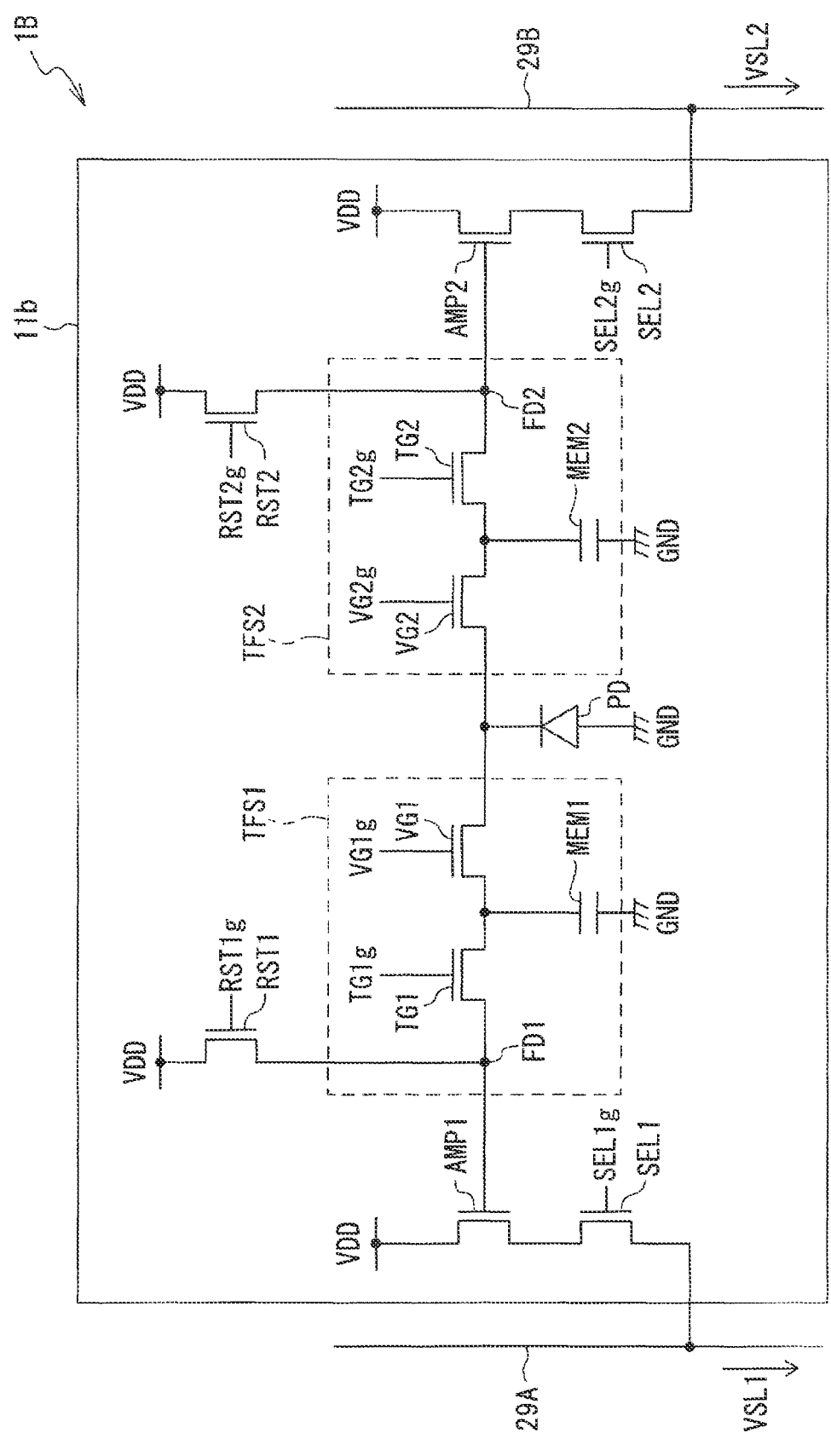
FIG. 19A is an equivalent circuit diagram depicting a configuration example of a pixel of a ranging sensor according to a ninth embodiment of the present technology.
Figure 19B:
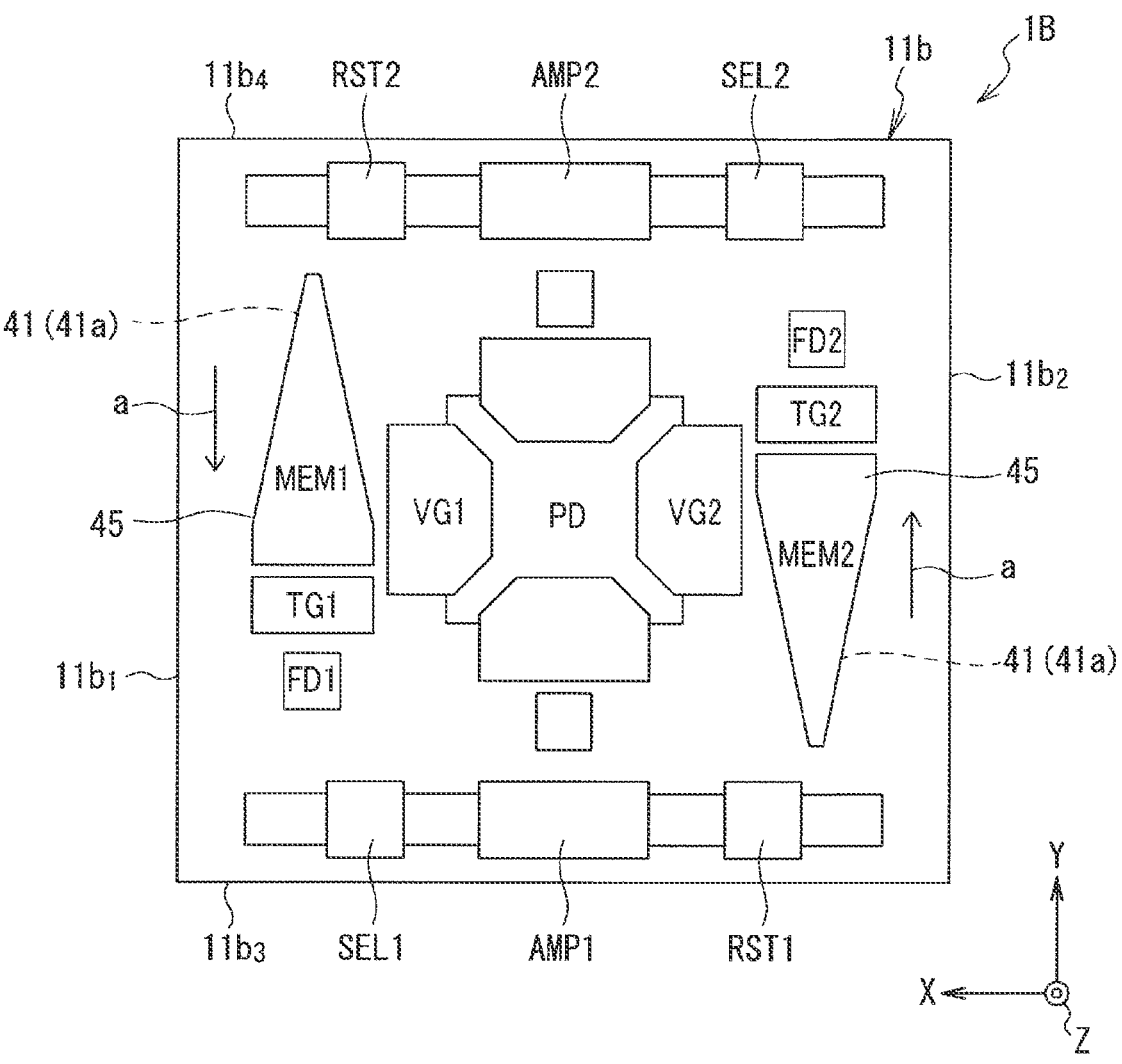
FIG. 19B is a plan view schematically depicting a planar configuration example of the pixel in FIG. 19A.

A ranging sensor 1B according to the ninth embodiment includes a pixel 11b depicted in FIGS. 19A and 19B. Although one pixel 11a is illustrated in FIG. 19B, the pixel 11b is repeatedly arranged in each of the X direction and the Y direction in a manner similar to the pixel 11 depicted in FIG. 1 of the first embodiment described above, and constitutes the pixel array unit 2A depicted in FIG. 1.

As depicted in FIG. 19A, the pixel 11b includes a photodiode PD as a photoelectric conversion element. Furthermore, the pixel 11b includes two first transfer transistors VG, two second transfer transistors TG, two memory parts MEM, two floating diffusions FD, two reset transistors RST, two amplification transistors AMP, and two selection transistors SEL.

Here, in a case where the two first transfer transistors VG, the two second transfer transistors TG, the two memory parts MEM, the two floating diffusions FD, the two reset transistors RST, the two amplification transistors AMP, and the two selection transistors SEL provided in the pixel 11b are distinguished from each other, as depicted in FIGS. 19A and 19B, they are referred to as first transfer transistors VG1 and VG2, second transfer transistors TG1 and TGTG2, memory parts MEM1 and MEM2, floating diffusions FD1 and FD2, amplification transistors AMP1 and AMP2, and selection transistors SEL1 and SEL2, respectively.

The first transfer transistor VG, the second transfer transistor TG, the reset transistor RST, the amplification transistor AMP, and the selection transistor SEL each include, for example, an n-channel conductivity type MOS transistor.

When a first transfer drive signal VG1g supplied to a gate electrode of the first transfer transistor VG1 becomes active, the first transfer transistor VG1 is brought into conduction in response to the first transfer drive signal VG1g to transfer the signal electric charges accumulated in the photodiode PD to the memory part MEM1. When a first transfer drive signal VG2g supplied to a gate electrode of the first transfer transistor VG2 becomes active, the first transfer transistor VG2 is brought into conduction in response to the first transfer drive signal VG2g to transfer the electric charges accumulated in the photodiode PD to the memory part MEM2.

When a second transfer drive signal TG1g supplied to a gate electrode of the second transfer transistor TG1 becomes active, the second transfer transistor TG1 is brought into conduction in response to the second transfer drive signal TG1g to transfer the signal electric charges accumulated in the memory part MEM1 to the floating diffusion FD1. When a second transfer drive signal TG2g supplied to a gate electrode of the second transfer transistor TG2 becomes active, the second transfer transistor TG2 is brought into conduction in response to the second transfer drive signal TG2g to transfer the electric charges accumulated in the memory part MEM2 to the floating diffusion FD2.

When a reset drive signal RST1g supplied to a gate electrode of the reset transistor RST1 becomes active, the reset transistor RST1 is brought into conduction in response to the reset drive signal RST1g to reset the potential of the floating diffusion FD1. When a reset drive signal RST2g supplied to a gate electrode of the reset transistor RST2 becomes active, the reset transistor RST2 is brought into conduction in response to the reset drive signal RST2g to reset the potential of the floating diffusion FD2. Note that, when the reset transistors RST1 and RST2 are brought into the active state, the second transfer transistors TG1 and TG2 are also brought into the active state, and the memory parts MEM1 and MEM2 are also reset.

When a source electrode of the amplification transistor AMP1 is connected to a vertical signal line 29A via the selection transistor SEL1, the amplification transistor AMP1 is connected to a constant current source (not illustrated) to form a source follower circuit. When a source electrode of the amplification transistor AMP2 is connected to a vertical signal line 29B via the selection transistor SEL2, the amplification transistor AMP2 is connected to the constant current source (not illustrated) to form a source follower circuit.

The selection transistor SEL1 is connected between the source electrode of the amplification transistor AMP1 and the vertical signal line 29A. When a selection signal SEL1g supplied to a gate electrode of the selection transistor SEL1 becomes active, the selection transistor SEL1 is brought into conduction in response to the selection signal SEL1g to output a detection signal VSL1 output from the amplification transistor AMP1 to the vertical signal line 29A.

The floating diffusions FD1 and FD2 each serve as an electric charge accumulation part that temporarily retains the electric charges transferred from the photodiode PD.

The selection transistor SEL2 is connected between the source electrode of the amplification transistor AMP2 and the vertical signal line 29B. When a selection signal SEL2g supplied to a gate electrode of the selection transistor SEL2 becomes active, the selection transistor SEL2 is brought into conduction in response to the selection signal SEL2g to output a detection signal VSL2 output from the amplification transistor AMP2 to the vertical signal line 29B.

The first transfer transistors VG1 and VG2, the second transfer transistors TG1 and TG2, the amplification transistors AMP1 and AMP2, and the selection transistors SEL1 and SEL2 are controlled by a vertical drive unit.

In the pixel circuit in FIG. 19A, the signal electric charges generated in the photodiode PD are distributed to and accumulated (retained) in the memory parts MEM1 and MEM2. Then, at the readout timing, the signal electric charges retained in the memory parts MEM1 and MEM2 are transferred to the floating diffusions FD1 and FD2, respectively, and are output from the pixel 11b. That is, the pixel 11b includes two transfer systems (a first transfer system TFS1 and a second transfer system TFS2) that transfer the signal electric charges generated by photoelectric conversion in the photodiode PD to the floating diffusions FD1 and FD2, respectively.

The first transfer system TFS1 includes the memory part MEM1 (first electric charge retaining part) and the floating diffusion FD1 (second electric charge retaining part), the first transfer transistor VG1 that transfers the signal electric charges generated by photoelectric conversion in the photodiode PD (photoelectric conversion part) to the memory part EME1, and the second transfer transistor TG1 that transfers the signal electric charges transferred by the first transfer transistor VG1 and retained in the memory part MEM1 to the floating diffusion FD1.

The second transfer system TFS2 includes the memory part MEM2 (first electric charge retaining part) and the floating diffusion FD2 (second electric charge retaining part), the first transfer transistor VG2 that transfers the signal electric charges generated by photoelectric conversion in the photodiode PD (photoelectric conversion part) to the memory part EME2, and the second transfer transistor TG2 that transfers the signal electric charges transferred by the first transfer transistor VG2 and retained in the memory part MEM2 to the floating diffusion FD2.

As depicted in FIG. 19B, the pixel 11b has a rectangular planar shape. The photodiode PD is arranged in a central region of the rectangular pixel 11b. The pixel 11b has first sides $11b_1$ and $11b_2$ located on opposite sides in the X direction, and a third side $11b_3$ and a fourth side $11b_4$ located on opposite sides in the Y direction.

As depicted in FIG. 19B, the first transfer transistor VG1 and the memory part MEM1 are arranged, outside the photodiode PD in plan view, in this order in the X direction from the central region of the pixel 11b toward the first side $11b_1$. Furthermore, the memory part MEM1, the second transfer transistor TG1, and the floating diffusion FD1 are arranged, adjacent to the first side $11b_1$ of the pixel 11b, in this order along the Y direction intersecting the X direction in plan view. The memory part MEM1, the second transfer transistor TG1, and the floating diffusion FD1 are arranged in this order in the signal electric charge transfer direction a in the memory part MEM1.

As depicted in FIG. 19B, the first transfer transistor VG2 and the memory part MEM2 are arranged, outside the photodiode PD in plan view, in this order in the X direction from the central region of the pixel 11b toward the second side $11b_2$. Furthermore, the memory part MEM2, the second transfer transistor TG2, and the floating diffusion FD2 are arranged, adjacent to the second side $11b_2$ of the pixel 11b, in this order along the Y direction intersecting the X direction in plan view. The memory part MEM2, the second transfer transistor TG2, and the floating diffusion FD2 are arranged in this order in the signal electric charge transfer direction a in the memory part MEM2.

The selection transistor SEL1, the amplification transistor AMP1, and the reset transistor RST1 are arranged, outside the photodiode PD and adjacent to the third side $11b_3$ of the rectangular pixel 11b, in this order along the third side $11b_3$.

The selection transistor SEL2, the amplification transistor AMP2, and the reset transistor RST2 are arranged, outside the photodiode PD and adjacent to the fourth side $11b_4$ of the rectangular pixel 11b, in this order along the fourth side $11b_4$.

As depicted in FIG. 19B, the signal electric charge transfer direction a in the memory part MEM1 and the signal electric charge transfer direction a in the memory part MEM2 are opposite to each other. Therefore, the memory part MEM1 becomes narrower from the third side 11b3 side toward the fourth side 11b4 side of the pixel 11b with an increase in distance from the floating diffusion FD1. On the other hand, the memory part MEM2 becomes narrower from the fourth side 11b4 side toward the third side 11b3 side of the pixel 11b with an increase in distance from the floating diffusion FD2. Then, the memory parts MEM1 and MEM2 are similar in configuration to, for example, the memory part MEM depicted in FIGS. 4A, 4B, 5A, 5B, and 5C of the first embodiment described above.

Also in the ranging sensor 1B according to the ninth embodiment, in a manner similar to the solid-state imaging device 1A according to the first embodiment described above, the signal electric charges can be reliably transferred by virtue of the narrow channel effect.

Furthermore, in the ranging sensor 1B according to the ninth embodiment, the signal electric charges can be reliably transferred, so that it is possible to reduce a ranging error and is thus possible to measure a distance with higher accuracy.

Note that, also in the ninth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Tenth Embodiment

A ranging sensor according to a tenth embodiment of the present technology is basically similar in configuration to the ranging sensor 1B according to the ninth embodiment described above, but is different in the planar shape of the memory part.

Figure 20:
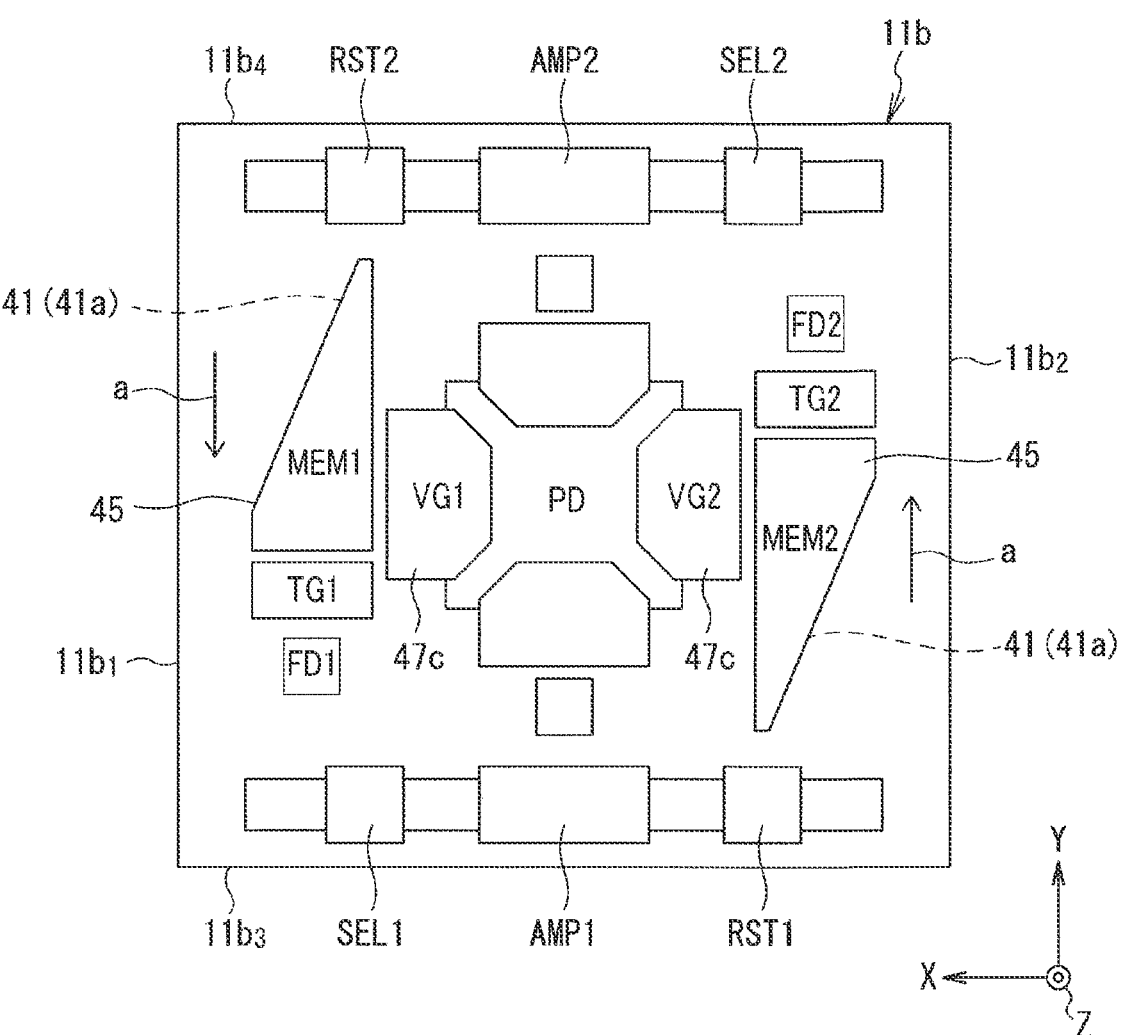
FIG. 20 is a plan view schematically depicting a planar configuration example of a pixel of a ranging sensor according to a tenth embodiment of the present technology.

That is, as depicted in FIG. 20, the memory part MEM1 has a planar shape with one side of the electrode 45 of the memory part MEM1 extending along one side of a gate electrode 47c of the first transfer transistor VG1. Similarly, the memory part MEM2 has a planar shape with one side of the electrode 45 of the memory part MEM2 extending along one side of a gate electrode 47c of the first transfer transistor VG2. Such shapes make it less prone to form a potential barrier between the first transfer transistor VG1 and the memory part MEM1 and allows the signal electric charges to be easily transferred from the first transfer transistor VG1 to the memory part MEM1. Similarly, the shapes make it less prone to form a potential barrier between the first transfer transistor VG2 and the memory part MEM2 and allows the signal electric charges to be easily transferred from the first transfer transistor VG2 to the memory part MEM2.

Furthermore, also in the ranging sensor according to the tenth embodiment, in a manner similar to the ranging sensor 1B according to the ninth embodiment described above, the signal electric charges can be reliably transferred by virtue of the narrow channel effect.

Furthermore, also in the ranging sensor according to the tenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the tenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Eleventh Embodiment

A ranging sensor according to an eleventh embodiment of the present technology is basically similar in configuration to the ranging sensor according to the tenth embodiment described above, but is different in the layout of the memory parts.

Figure 21:
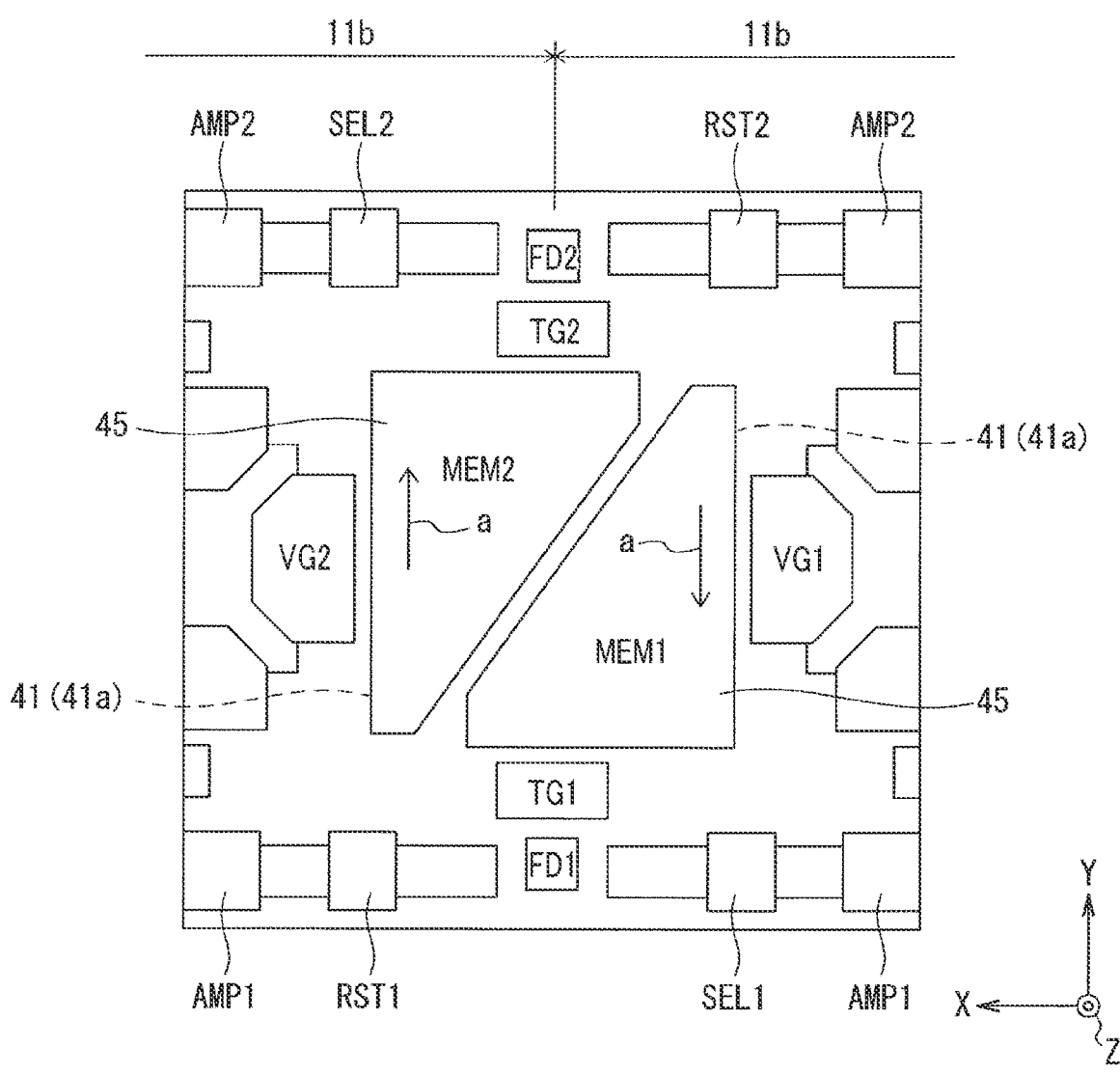
FIG. 21 is a plan view schematically depicting a planar configuration example of a pixel of a ranging sensor according to an eleventh embodiment of the present technology.

That is, as depicted in FIG. 21, the memory parts MEM1 and MEM2 are arranged over two pixels 11b adjacent to each other in the X direction. The memory parts MEM1 and MEM2 are arranged such that two pixels 11b adjacent to each other in the X direction share a region. Then, the memory part MEM1 of one pixel 11b and the memory part MEM2 of the other pixel 11b are arranged with their respective inclined surfaces facing each other. As described above, arranging, over the two pixels 11b adjacent to each other, the memory part MEM1 of one pixel 11b and the memory part MEM2 of the other pixel 11b allows an increase in the capacitance of each of the memory parts MEM1 and MEM2 without an increase in the planar size of each pixel 11b.

Furthermore, also in the ranging sensor according to the eleventh embodiment, in a manner similar to the ranging sensor 1B according to the ninth embodiment described above, the signal electric charges can be reliably transferred by virtue of the narrow channel effect.

Furthermore, also in the ranging sensor according to the eleventh embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the eleventh embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Twelfth Embodiment

A ranging sensor according to a twelfth embodiment of the present technology is basically similar in configuration to the ranging sensor according to the eleventh embodiment described above, but is different in the shape of the gate electrode of the second transfer transistor.

Figure 22:
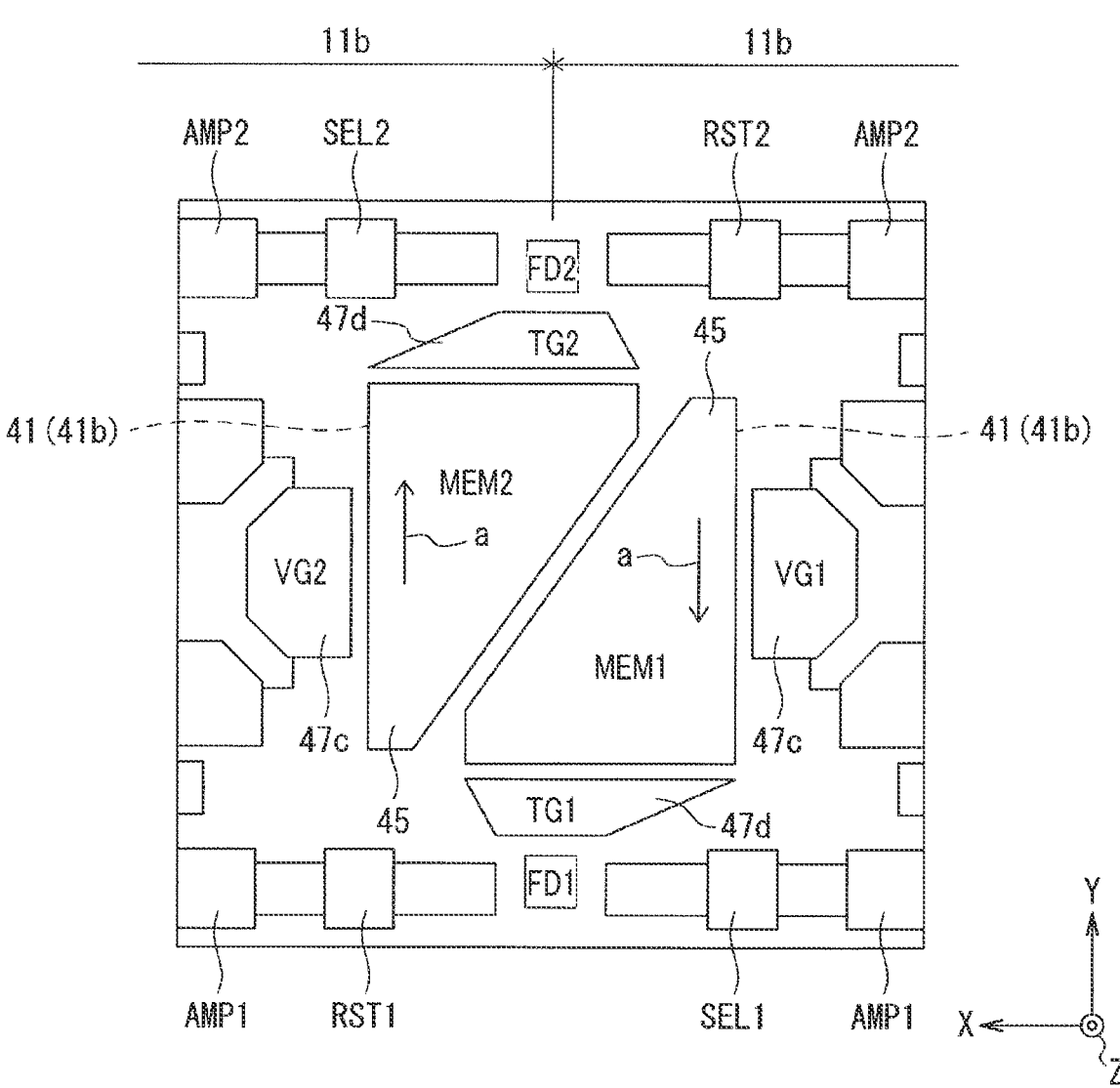
FIG. 22 is a plan view schematically depicting a planar configuration example of a pixel of a ranging sensor according to a twelfth embodiment of the present technology.

That is, as depicted in FIG. 22, the second transfer transistor TG1 has a gate electrode 47d extending from one end side to the other end side in the width direction of the memory part MEM1. Furthermore, the second transfer transistor TG2 has a gate electrode 47d extending from one end side to the other end side in the width direction of the memory part MEM2. Such a configuration makes a gate width Wg of the gate electrode 47d of the second transfer transistor TG1 larger, so that the signal electric charges are easily transferred from the memory part MEM1 to the second transfer transistor TG1. Similarly, the configuration makes the gate width Wg of the gate electrode 47d of the second transfer transistor TG2 larger, so that the signal electric charges are easily transferred from the memory part MEM2 to the second transfer transistor TG2.

Furthermore, also in the ranging sensor according to the twelfth embodiment, in a manner similar to the ranging sensor 1B according to the ninth embodiment described above, the signal electric charges can be reliably transferred by virtue of the narrow channel effect.

Furthermore, also in the ranging sensor according to the twelfth embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the twelfth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Thirteenth Embodiment

A ranging sensor according to a thirteenth embodiment of the present technology is basically similar in configuration to the ranging sensor according to the tenth embodiment described above, but is different in the layout of the memory parts.

Figure 23:
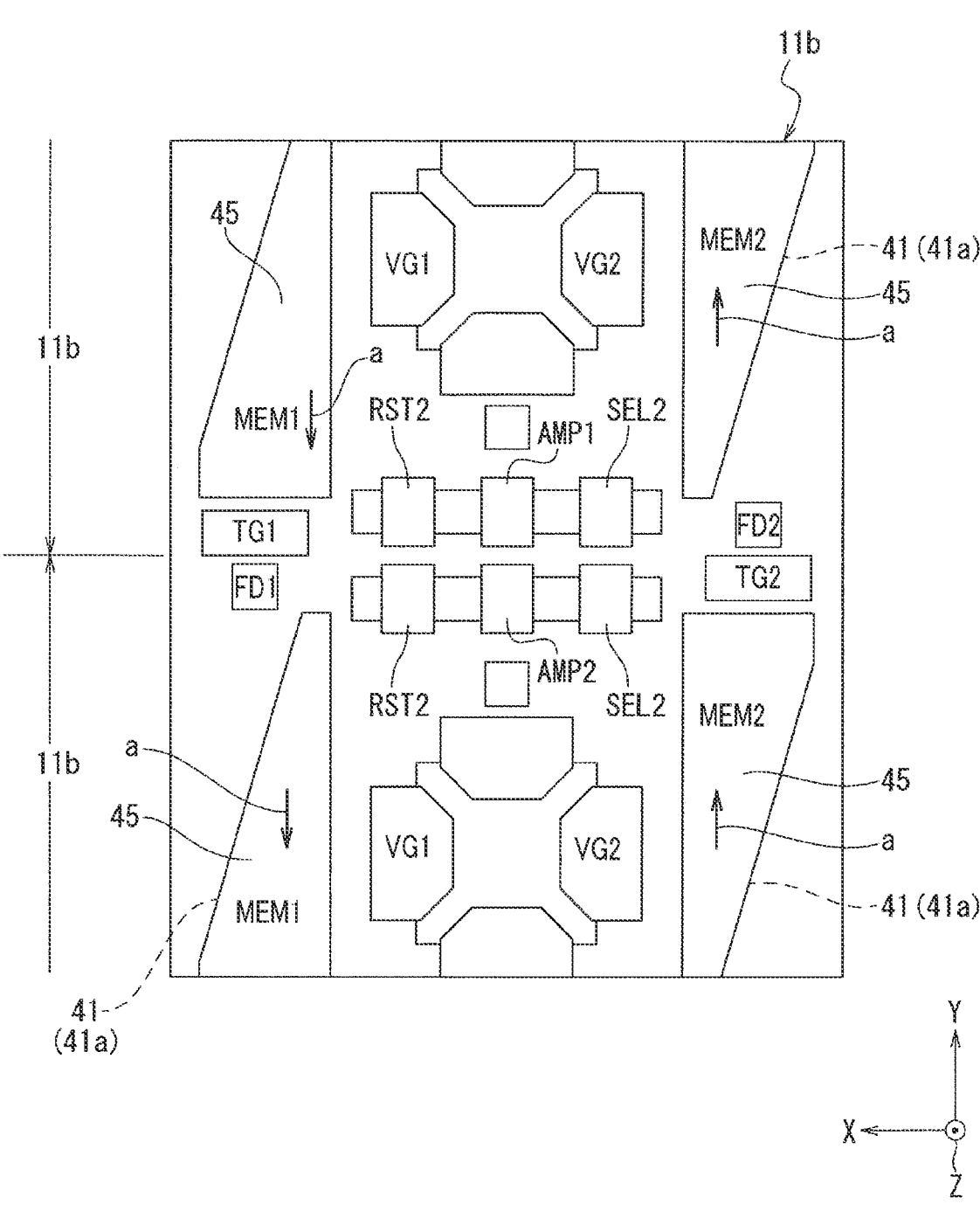
FIG. 23 is a plan view schematically depicting a planar configuration example of a pixel of a ranging sensor according to a thirteenth embodiment of the present technology.

That is, as depicted in FIG. 23, the floating diffusions FD1 and FD2 are arranged in the other pixels 11b adjacent to each other in the Y direction. That is, the pixels 11b adjacent to each other in the Y direction share a region. Such a configuration allows an increase in the capacitance of each of the memory parts MEM1 and MEM2 without an increase in the planar size of each pixel 11b.

Furthermore, also in the ranging sensor according to the thirteenth embodiment, in a manner similar to the ranging sensor 1B according to the ninth embodiment described above, the signal electric charges can be reliably transferred by virtue of the narrow channel effect.

Furthermore, also in the ranging sensor according to the thirteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the thirteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Fourteenth Embodiment

A ranging sensor according to a fourteenth embodiment of the present technology is basically similar in configuration to the ranging sensor according to the ninth embodiment described above, but is different in the following configuration.

Figure 24:
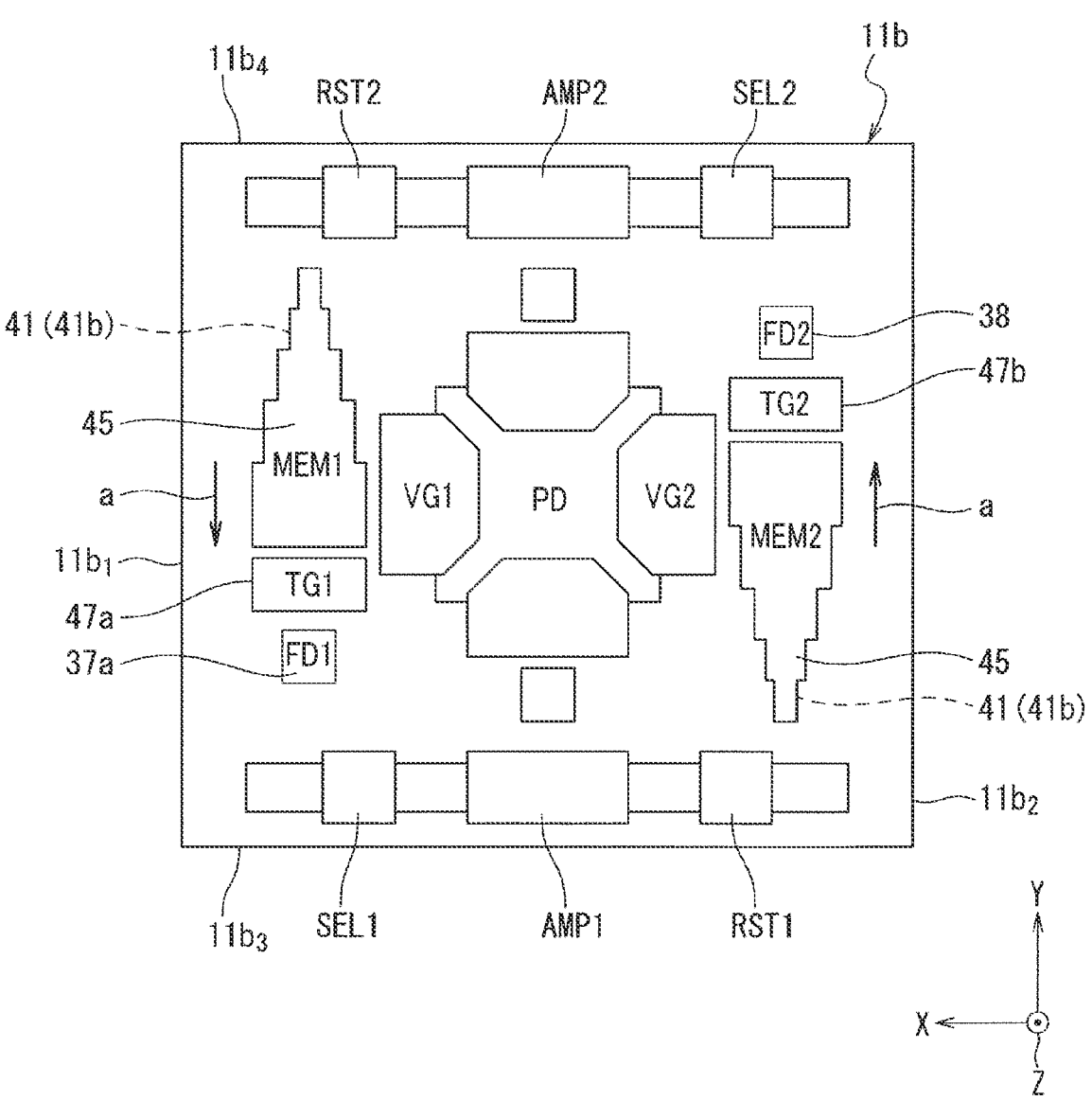
FIG. 24 is a plan view schematically depicting a planar configuration example of a pixel of a ranging sensor according to a fourteenth embodiment of the present technology.

That is, as depicted in FIG. 24, the planar pattern of the memory part MEM depicted in FIGS. 7A and 7B of the second embodiment described above is applied to the memory parts MEM1 and MEM2 of the fourteenth embodiment. Specifically, as will be described with reference to FIGS. 7A and 7B, the narrow portion 41b included in each of the memory parts MEM1 and MEM2 becomes narrower stepwise (in a stepped manner) with an increase in distance from the floating diffusions FD1 and FD2. In other words, the narrow portion 41b becomes narrower stepwise from the downstream side (side adjacent to the floating diffusions FD1 and FD2) toward the upstream side in the electric charge transfer direction a in the semiconductor region 41.

Furthermore, also in the ranging sensor according to the fourteenth embodiment, in a manner similar to the ranging sensor 1B according to the ninth embodiment described above, the signal electric charges can be reliably transferred by virtue of the narrow channel effect.

Furthermore, also in the ranging sensor according to the fourteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the fourteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Fifteenth Embodiment

A ranging sensor according to a fifteenth embodiment of the present technology is basically similar in configuration to the ranging sensor 1B according to the ninth embodiment described above, but is different in the following configuration.

Figure 25:
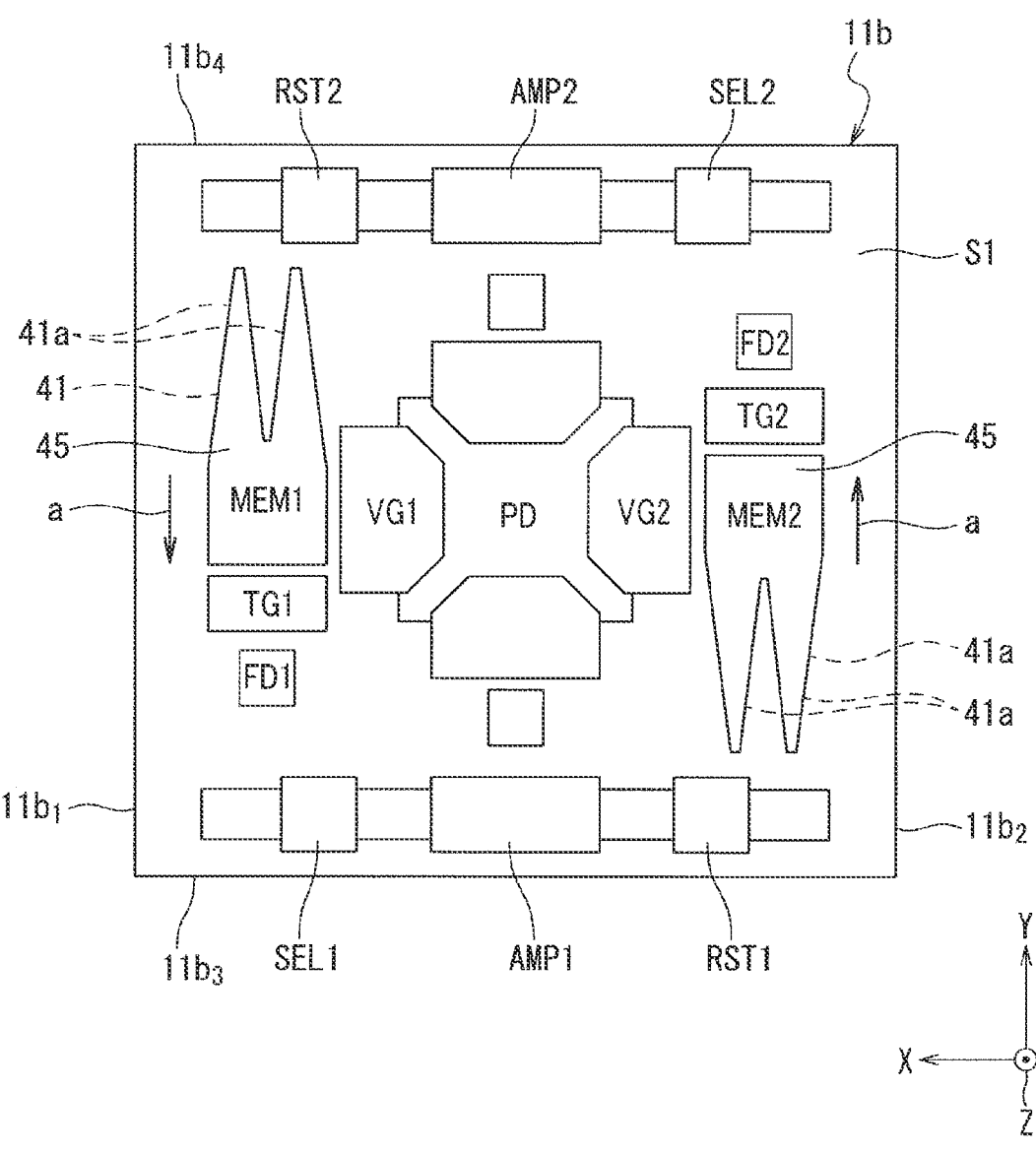
FIG. 25 is a plan view schematically depicting a planar configuration example of a pixel of a ranging sensor according to a fifteenth embodiment of the present technology.

That is, as depicted in FIG. 25, the planar pattern of the memory part MEM depicted in FIGS. 8A and 8B of the third embodiment described above is applied to the memory parts MEM1 and MEM2 of the fifteenth embodiment. Specifically, as will be described with reference to FIGS. 8A and 8B, the narrow portion 41a included in each of the memory parts MEM1 and MEM2 includes a plurality of narrow portions 41a arranged side by side in a direction intersecting the electric charge conveyance direction a in the semiconductor region 41. In the fifteenth embodiment, the semiconductor region 41 includes two narrow portions 41a. The other configuration is similar to the configuration of the first embodiment described above.

Furthermore, also in the ranging sensor according to the fifteenth embodiment, in a manner similar to the ranging sensor 1B according to the ninth embodiment described above, the signal electric charges can be reliably transferred by virtue of the narrow channel effect.

Furthermore, also in the ranging sensor according to the fifteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Note that, also in the fifteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Sixteenth Embodiment

A ranging sensor according to a sixteenth embodiment of the present technology is basically similar in configuration to the ranging sensor 1B according to the ninth embodiment described above, but is different in the following configuration.

Figure 26:
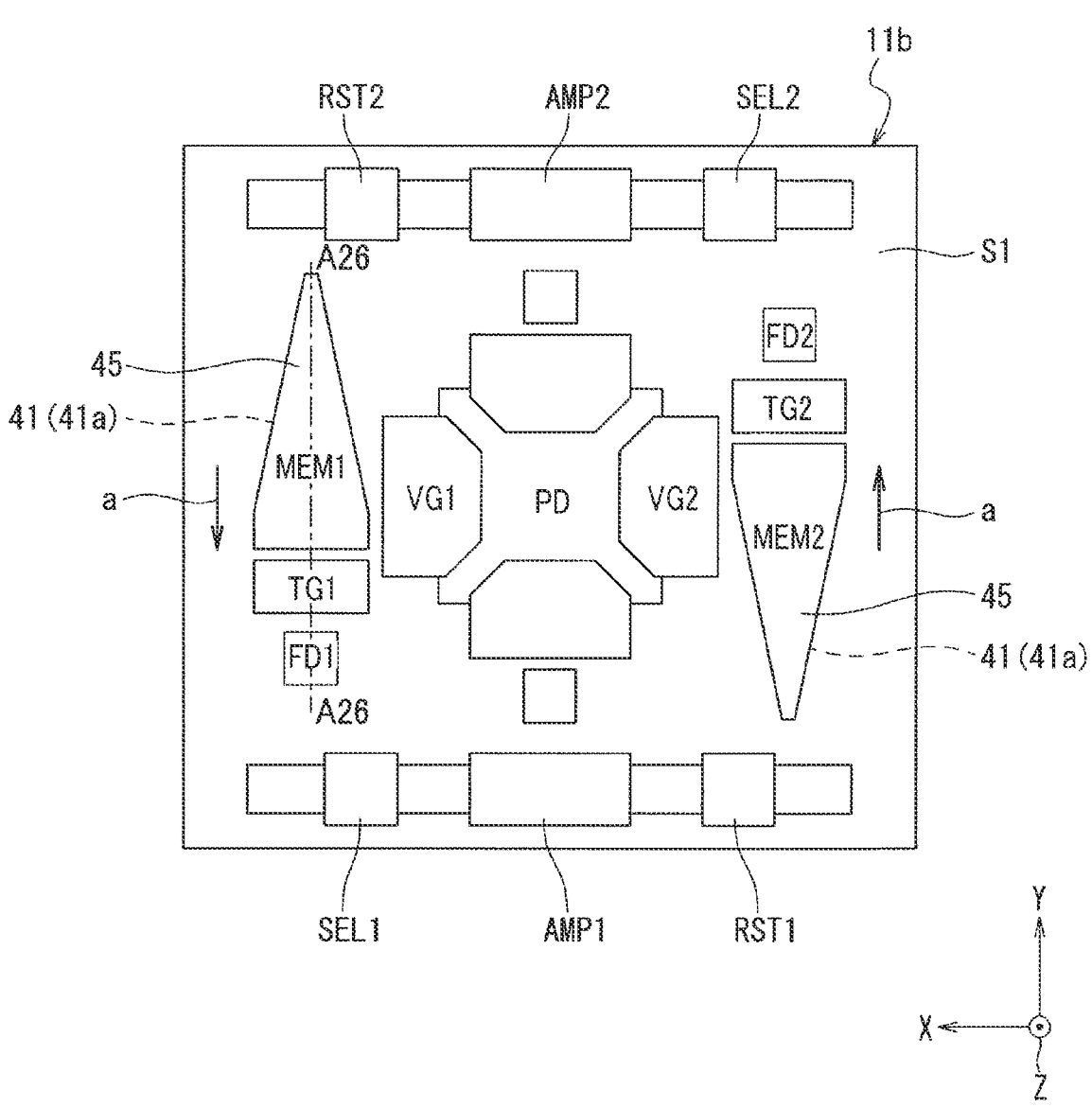
FIG. 26 is a plan view schematically depicting a planar configuration example of a pixel of a ranging sensor according to a sixteenth embodiment of the present technology.
Figure 27:
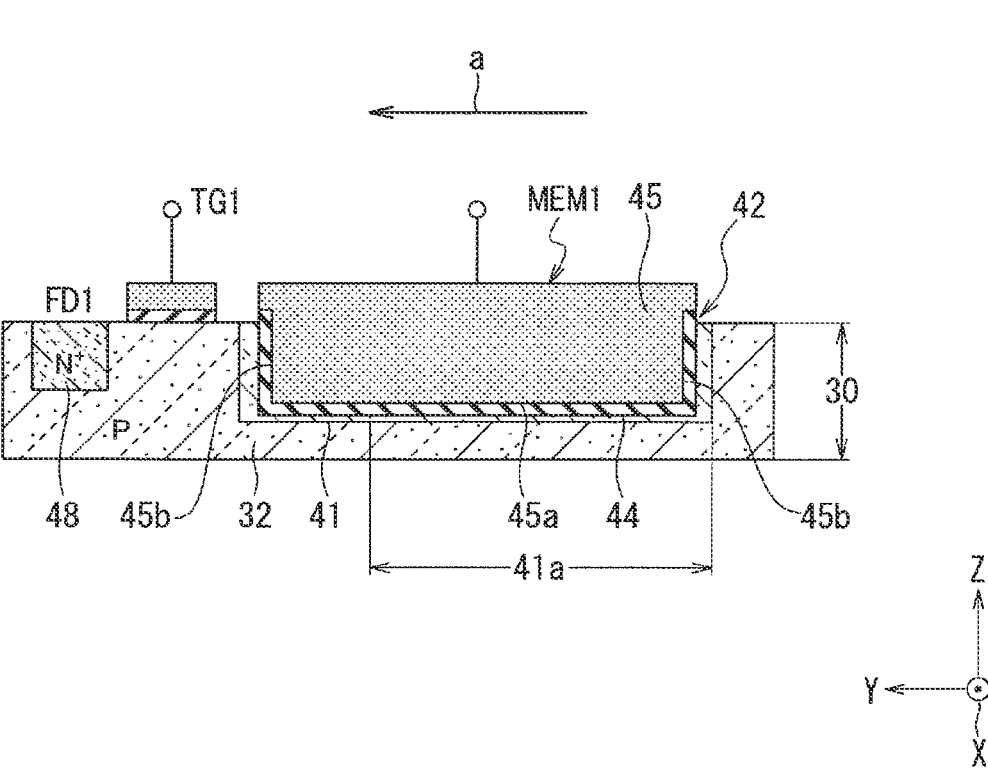
FIG. 27 is a cross-sectional view schematically depicting a cross-sectional structure taken along a line A26-A26 in FIG. 26.
Figures 28, 29A:
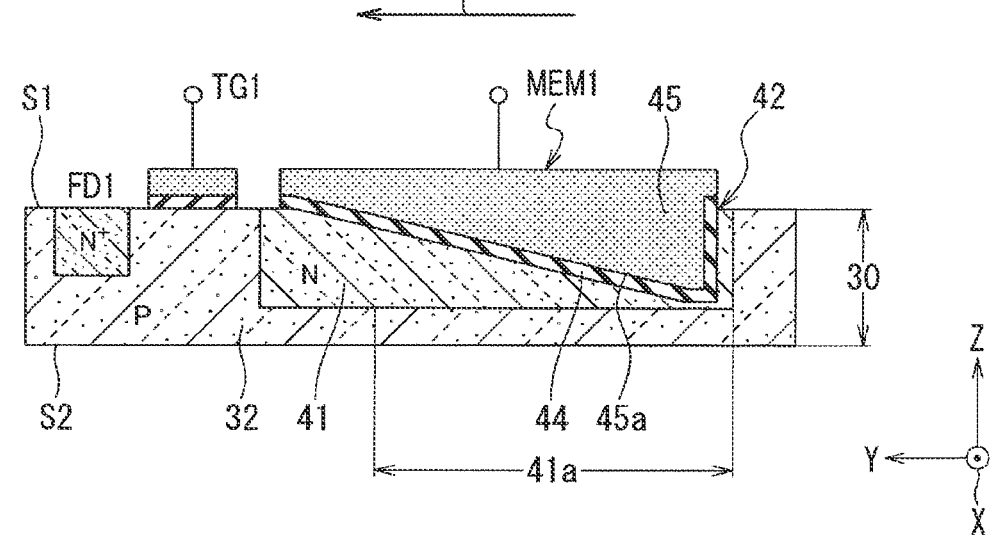
FIG. 28 is a plan view schematically depicting a planar configuration example of a pixel of a ranging sensor according to a seventeenth embodiment of the present technology.
FIG. 29A is a cross-sectional view schematically depicting a cross-sectional structure taken along a line A28-A28 in FIG. 28.
Figure 29B:
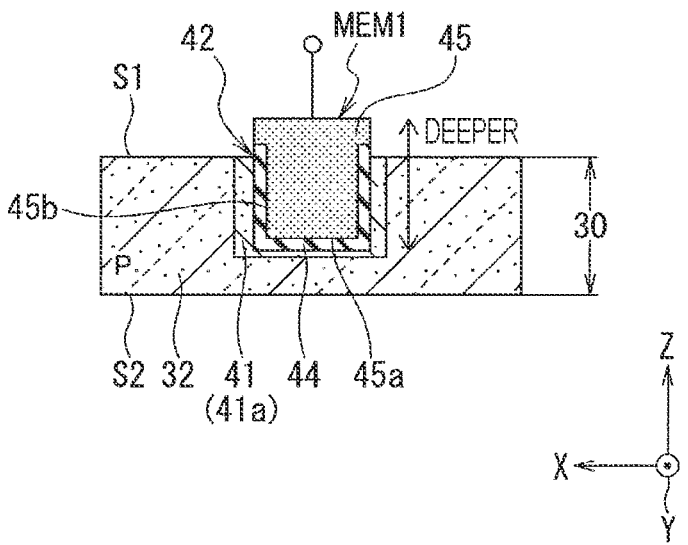
FIG. 29B is a cross-sectional view schematically depicting a cross-sectional structure taken along a line B28-B28 in FIG. 28.
Figure 29C:
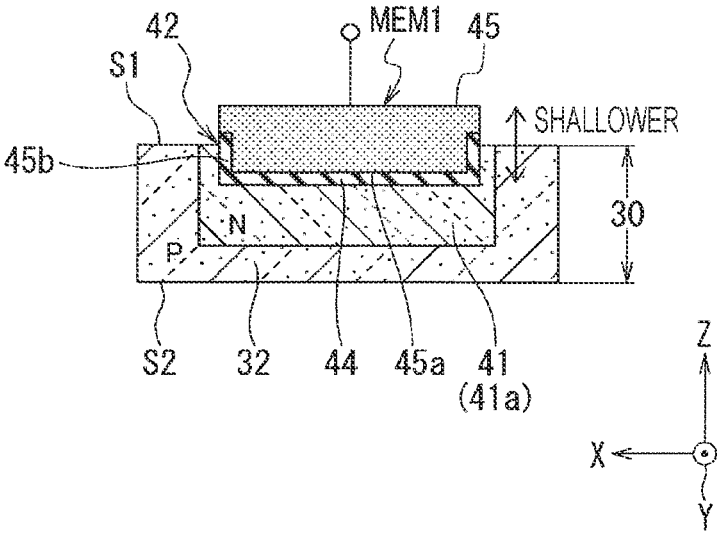
FIG. 29C is a cross-sectional view schematically depicting a cross-sectional structure taken along a line C28-C28 in FIG. 28.

That is, as depicted in FIGS. 26 and 27, the configuration of the memory part MEM depicted in FIGS. 9 and 10 of the fourth embodiment described above is applied to the memory parts MEM1 and MEM2 of the sixteenth embodiment. Specifically, as depicted in FIGS. 26 and 27, the memory part MEM1 of the sixteenth embodiment includes the groove portion 42 provided in the surface layer portion of the semiconductor layer 30 adjacent to the first surface S1, the groove portion 42 extending downward from the first surface S1 of the semiconductor layer 30 in the thickness direction, the n-type semiconductor region 41 provided in the semiconductor layer 30 (p-type well region 32) to face the bottom surface and the side surface (inner wall surface) of the groove portion 42, the insulation film 44 provided along the bottom surface and the side surface (inner wall surface) of the groove portion 42, and the electrode 45 provided in the groove portion 42 with the insulation film 44 interposed between the electrode 45 and the groove portion 42. Then, the n-type semiconductor region 41 includes the narrow portion 41a. Similarly, the memory part MEM2 of the sixteenth embodiment is also similar in configuration to the memory part MEM1 of the sixteenth embodiment.

Furthermore, also in the ranging sensor according to the sixteenth embodiment, in a manner similar to the ranging sensor 1B according to the ninth embodiment described above, the signal electric charges can be reliably transferred by virtue of the narrow channel effect.

Furthermore, also in the ranging sensor according to the sixteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Furthermore, the ranging sensor according to the sixteenth embodiment can also produce effects similar to the effects produced by the fourth embodiment described above.

Note that, also in the sixteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Seventeenth Embodiment

A ranging sensor according to a seventeenth embodiment of the present technology is basically similar in configuration to the ranging sensor 1B according to the ninth embodiment described above, but is different in the following configuration.

That is, as depicted in FIGS. 28, 29A, 29B, and 29C, the configuration of the memory part MEM depicted in FIGS. 11, 12A, 12B, and 12C of the fifth embodiment described above is applied to the memory part MEM1 of the seventeenth embodiment. Although not illustrated, a configuration similar to the configuration of the memory part MEM1 is also applied to the memory part MEM2. Specific configurations of the memory parts MEM1 and MEM2 have been described in the fifth embodiment described above, so that no detailed description will be given in the seventeenth embodiment.

Furthermore, also in the ranging sensor according to the sixteenth embodiment, in a manner similar to the ranging sensor 1B according to the ninth embodiment described above, the signal electric charges can be reliably transferred by virtue of the narrow channel effect.

Furthermore, also in the ranging sensor according to the seventeenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Furthermore, the ranging sensor according to the sixteenth embodiment can also produce effects similar to the effects produced by the solid-state imaging device of the fifth embodiment described above.

Note that, also in the seventeenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Eighteenth Embodiment

A ranging sensor according to an eighteenth embodiment of the present technology is basically similar in configuration to the ranging sensor 1B according to the ninth embodiment described above, but is different in the following configuration.

That is, as depicted in FIGS. 30, 31A, 31B, and 31C, the configuration of the memory part MEM depicted in FIGS. 13, 14A, 14B, and 14C of the sixth embodiment described above is applied to the memory part MEM1 of the eighteenth embodiment. Although not illustrated, a configuration similar to the configuration of the memory part MEM1 is also applied to the memory part MEM2 of the eighteenth embodiment. Specific configurations of the memory parts MEM1 and MEM2 have been described in the sixth embodiment described above, so that no detailed description will be given in the eighteenth embodiment.

Furthermore, also in the ranging sensor according to the eighteenth embodiment, in a manner similar to the ranging sensor 1B according to the ninth embodiment described above, the signal electric charges can be reliably transferred by virtue of the narrow channel effect.

Furthermore, also in the ranging sensor according to the eighteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Furthermore, the ranging sensor according to the eighteenth embodiment can also produce effects similar to the effects produced by the solid-state imaging device of the sixth embodiment described above.

Note that, also in the eighteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Nineteenth Embodiment

A ranging sensor according to a nineteenth embodiment of the present technology is basically similar in configuration to the ranging sensor 1B according to the ninth embodiment described above, but is different in the following configuration.

That is, as depicted in FIGS. 32 and 33, a configuration similar to the configuration of the memory part MEM depicted in FIGS. 15 and 16 of the seventh embodiment described above is applied to the memory part MEM1 of the nineteenth embodiment. Although not illustrated, a configuration similar to the configuration of the memory part MEM1 of the nineteenth embodiment is also applied to the memory part MEM2 of the nineteenth embodiment. Specific configurations of the memory parts MEM1 and MEM2 have been described in the seventh embodiment described above, so that no detailed description will be given in the nineteenth embodiment.

Furthermore, also in the ranging sensor according to the nineteenth embodiment, in a manner similar to the ranging sensor 1B according to the ninth embodiment described above, the signal electric charges can be reliably transferred by virtue of the narrow channel effect.

Furthermore, also in the ranging sensor according to the nineteenth embodiment, in a manner similar to the ranging sensor 1B according to the ninth embodiment described above, the signal electric charges can be reliably transferred, so that it is possible to reduce a ranging error and is thus possible to measure a distance with higher accuracy.

Furthermore, the ranging sensor according to the nineteenth embodiment can also produce effects similar to the effects produced by the solid-state imaging device of the seventh embodiment described above.

Note that, also in the nineteenth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Twentieth Embodiment

A ranging sensor according to a twentieth embodiment of the present technology is basically similar in configuration to the ranging sensor 1B according to the ninth embodiment described above, but is different in the following configuration.

That is, as depicted in FIGS. 34, 35A, and 35B, a configuration similar to the configuration of the memory part MEM depicted in FIGS. 17, 18A, and 18B of the eighth embodiment described above is applied to the memory part MEM1 of the twentieth embodiment. Although not illustrated, a configuration similar to the configuration of the memory part MEM1 of the twentieth embodiment is also applied to the memory part MEM2 of the twentieth embodiment. Specific configurations of the memory parts MEM1 and MEM2 have been described in the eighth embodiment described above, so that no detailed description will be given in the twentieth embodiment.

Furthermore, also in the ranging sensor according to the twentieth embodiment, in a manner similar to the ranging sensor 1B according to the ninth embodiment described above, the signal electric charges can be reliably transferred by virtue of the narrow channel effect.

Furthermore, also in the ranging sensor according to the twentieth embodiment, in a manner similar to the ranging sensor 1B according to the ninth embodiment described above, the signal electric charges can be reliably transferred, so that it is possible to reduce a ranging error and is thus possible to measure a distance with higher accuracy.

Furthermore, the ranging sensor according to the twentieth embodiment can also produce effects similar to the effects produced by the solid-state imaging device 1 of the eighth embodiment described above.

Note that, also in the twentieth embodiment, it is preferable that the planar shape of the n-type semiconductor region 41 be similar in size and shape to the planar shape of the electrode 45, and the planar shape of the insulation film 44 interposed between the semiconductor region 41 and the electrode 45 be also similar in size and shape to the planar shape of the electrode 45.

Note that, in the first to twentieth embodiments described above, the width of the n-type semiconductor region 41 is defined such that the upstream side in the signal electric charge transfer direction a is narrower than the downstream side in the signal electric charge transfer direction a, or alternatively, the width of the electrode 45 may be defined such that the upstream side in the signal electric charge transfer direction a is narrower than the downstream side in the signal electric charge transfer direction a.

Twenty-First Embodiment

<<Example of Application to Electronic Device>>

The present technology (technology according to the present disclosure) may be applied to various electronic devices such as an imaging device such as a digital still camera or a digital video camera, a mobile phone having an imaging function, or other devices having an imaging function.

FIG. 36 is a diagram depicting a schematic configuration of an electronic device (for example, a camera) according to a twenty-first embodiment of the present technology.

As depicted in FIG. 36, an electronic device 100 includes the solid-state imaging device 101, the optical lens 102, a shutter device 103, a drive circuit 104, and a signal processing circuit 105. The electronic device 100 indicates an embodiment in a case where the solid-state imaging devices and the ranging sensors according to the first to twentieth embodiments of the present technology are each used as the solid-state imaging device 101 in an electronic device (for example, a camera).

The optical lens 102 forms an image of image light (incident light 106) from a subject on an imaging surface of the solid-state imaging device 101. As a result, signal electric charges are accumulated in the solid-state imaging device 101 over a certain period. The shutter device 103 controls a light irradiation period and a light shielding period for the solid-state imaging device 101. The drive circuit 104 supplies a drive signal for controlling a transfer operation of the solid-state imaging device 101 and a shutter operation of the shutter device 103. A signal of the solid-state imaging device 101 is transferred in accordance with a drive signal (timing signal) supplied from the drive circuit 104. The signal processing circuit 105 performs various types of signal processing on the signal (pixel signal) output from the solid-state imaging device 101. A video signal subjected to the signal processing is stored in a storage medium such as a memory or output to a monitor.

With such a configuration, the electronic device 100 according to the twenty-first embodiment causes a light antireflection part in the solid-state imaging device 101 to inhibit light reflection off a light shielding film or an insulation film in contact with an air layer, so that it is possible to inhibit deviation and to improve image quality.

Note that the electronic device 100 to which the solid-state imaging device of each of the embodiments described above can be applied is not limited to a camera, and the solid-state imaging device can also be applied to other electronic devices. For example, the solid-state imaging device may be applied to an imaging device such as a camera module for a mobile device such as a mobile phone or a tablet terminal.

Furthermore, the present technology is applicable to any photodetection device including not only the above-described solid-state imaging device as an image sensor but also a ranging sensor also called a time of flight (ToF) sensor that measures a distance, and the like. The ranging sensor is a sensor that emits irradiation light toward an object, detects reflected light that is the irradiation light reflected off a surface of the object, and calculates a distance to the object on the basis of a flight time from the emission of the irradiation light to the reception of the reflected light. As a structure of an element isolation region of the ranging sensor, the above-described structure of the element isolation region may be employed.

Note that the present technology may have the following configurations.

(1)
A photodetection device including:
a semiconductor layer having a first surface and a second surface located on opposite sides of the semiconductor layer in a thickness direction;
a photoelectric conversion part provided in the semiconductor layer;
first and second electric charge retaining parts provided adjacent to the first surface of the semiconductor layer;
a first transfer transistor that transfers signal electric charges generated by photoelectric conversion in the photoelectric conversion part to the first electric charge retaining part; and
a second transfer transistor that transfers the signal electric charges transferred by the first transfer transistor and retained in the first electric charge retaining part to the second electric charge retaining part, in which
the first electric charge retaining part includes:
a semiconductor region provided adjacent to the first surface of the semiconductor layer; and
an electrode placed on the semiconductor region with an insulation film interposed between the electrode and the semiconductor region, and
an upstream side of the electrode in a direction in which the signal electric charges are transferred is narrower than a downstream side of the electrode in the direction in which the signal electric charges are transferred.

(2)
The photodetection device described in (1), in which
a side of the electrode remote from the second electrode charge retaining part is narrower than a side of the electrode adjacent to the second electric charge retaining part.

(3)
The photodetection device described in (1) or (2), in which
the first transfer transistor and the first electric charge retaining part are arranged side by side in a first direction in plan view, and
the second electric charge retaining part, the second transistor, and the first electric charge retaining part are arranged side by side in a second direction intersecting the first direction in plan view.

(4)
The photodetection device described in any one of (1) to (3), in which
the electrode includes a small-width portion that becomes gradually narrower with an increase in distance from the second electric charge retaining part.

(5)
The photodetection device described in any one of (1) to (3), in which
the electrode includes a narrow portion that becomes narrower stepwise with an increase in distance from the second electric charge retaining part.

(6)
The photodetection device described in (4) or (5), in which
the electrode includes a plurality of the narrow portions arranged side by side in a direction intersecting the direction in which the signal electric charges are transferred in plan view.

(7)
The photodetection device described in any one of (1) to (6), in which
the first electric charge retaining part further includes a groove portion provided in the semiconductor region,
the electrode is provided in the groove portion, and
the semiconductor region faces, in the groove portion, a bottom surface and a side surface of the electrode with the insulation film interposed between the semiconductor region and the electrode.

(8)
The photodetection device described in (7), in which
a downstream side of the groove portion in the direction in which the signal electric charges are transferred is shallower than an upstream side of the groove portion in the direction in which the signal electric charges are transferred.

(9)
The photodetection device described in (8), in which
the groove portion becomes gradually shallower toward the second electric charge retaining part.

(10)
The photodetection device described in (8), in which
the groove portion becomes shallower stepwise toward the second electric charge retaining part.

(11)
The photodetection device described in any one of (7) to (10), in which
two or more of the groove portions are provided side by side in a direction intersecting the direction in which the signal electric charges are transferred.

(12)
The photodetection device described in any one of (1) to (11) in which
the first electric charge retaining part further includes a pinning layer arranged between the semiconductor region and the insulation film.

(13)
The photodetection device described in any one of (1) to (12) in which
the electrode is integrated with a gate electrode of the first transfer transistor.

(14)
A photodetection device including:
a semiconductor layer having a first surface and a second surface located on opposite sides of the semiconductor layer in a thickness direction; and

a plurality of pixels provided in the semiconductor layer, in which each of the plurality of pixels includes:

a photoelectric conversion part provided in the semiconductor layer; and two transfer systems that transfer signal electric charges generated by photoelectric conversion in the photoelectric conversion part to a corresponding second electric charge retaining part, each of the two transfer systems includes:

a first electric charge retaining part and the second electric charge retaining part provided adjacent to the first surface of the semiconductor layer;

a first transfer transistor that transfers the signal electric charges generated by photoelectric conversion in the photoelectric conversion part to the first electric charge retaining part; and a second transfer transistor that transfers the signal electric charges transferred by the first transfer transistor and retained in the first electric charge retaining part to the second electric charge retaining part, the first electric charge retaining part includes:

a semiconductor region provided adjacent to the first surface of the semiconductor layer; and an electrode placed on the semiconductor region with an insulation film interposed between the electrode and the semiconductor region, and an upstream side of the electrode in a direction in which the signal electric charges are transferred is narrower than a downstream side of the electrode in the direction in which the signal electric charges are transferred.

(15)

The photodetection device described in (14), in which the first transfer transistor and the first electric charge retaining part are arranged side by side in a first direction in plan view, and the second electric charge retaining part, the second transistor, and the first electric charge retaining part are arranged side by side in a second direction intersecting the first direction in plan view.

(16)

The photodetection device described in (14) or (15), in which the first electric charge retaining part has a planar shape with one side of the electrode of the first electric charge retaining part extending along one side of a gate electrode of the first transfer transistor.

(17)

The photodetection device described in (15), in which the first electric charge retaining part is arranged over two of the pixels adjacent to each other in the first direction.

(18)

The photodetection device described in any one of (14) to (17), in which a gate electrode of the second transfer transistor extends from one end side to another end side in a width direction of the first electric charge retaining part.

(19)

The photodetection device described in (15), in which the second electric charge retaining part is arranged in another one of the pixels adjacent to each other in the second direction.

32

(20)

The photodetection device described in (14), in which a side of the electrode remote from the second electrode charge retaining part is narrower than a side of the electrode adjacent to the second electric charge retaining part.

(21)

The photodetection device described in any one of (14) to (20), in which the electrode includes a small-width portion that becomes gradually narrower with an increase in distance from the second electric charge retaining part.

(22)

The photodetection device described in any one of (14) to (20), in which the electrode includes a narrow portion that becomes narrower stepwise with an increase in distance from the second electric charge retaining part.

(23)

The photodetection device described in any one of (14) to (22), in which two or more of the narrow portions are provided side by side in a direction intersecting the direction in which the signal electric charges are transferred in plan view.

(24)

The photodetection device described in any one of (14) to (23), in which the first electric charge retaining part further includes a groove portion provided in the semiconductor region, the electrode is provided in the groove portion, and the electrode faces, in the groove portion, a bottom surface and a side surface of the electrode with the insulation film interposed between the semiconductor region and the electrode.

(25)

The photodetection device described in (24), in which an upstream side of the groove portion in the direction in which the signal electric charges are transferred is shallower than a downstream side of the groove portion in the direction in which the signal electric charges are transferred.

(26)

The photodetection device described in (24), in which the groove portion becomes gradually shallower toward the second electric charge retaining part.

(27)

The photodetection device described in (24), in which the groove portion becomes shallower stepwise toward the second electric charge retaining part.

(28)

The photodetection device described in any one of (24) to (27), in which two or more of the groove portions are provided side by side in a direction intersecting the direction in which the signal electric charges are transferred.

(29)

The photodetection device described in any one of (14) to (28) in which the first electric charge retaining part further includes a pinning layer arranged between the semiconductor region and the insulation film.

(30)

An electronic device including:

a photodetection device described in (1) or (14);

an optical lens that forms an image of image light from a subject on an imaging surface of the photodetection device; and

a signal processing circuit that performs signal processing on a signal output from the photodetection device.

The scope of the present technology is not limited to the illustrated and described embodiments, and includes all embodiments that provide effects equivalent to the effects intended to be provided by the present technology. Moreover, the scope of the present technology is not limited to the combinations of the features of the invention defined by the claims, and may be defined by any desired combination of specific features among all the disclosed features.

REFERENCE SIGNS LIST

1A Solid-state imaging device
1B Ranging sensor
2 Semiconductor chip
11 Pixel
12 Readout circuit
30 Semiconductor layer
32 p-type well region
33 n-type semiconductor region
34 p-type semiconductor region
36 n-type semiconductor region
38 n-type semiconductor region
41 n-type semiconductor region
41*a*, 41*b* Narrow portion
44 Insulation film
45 Electrode
FD Floating diffusion
MEM Memory part
OFD Overflow drain
OFG Discharge transistor
PD Photodiode
TRG Second transfer transistor
TRX First transfer transistor

The invention claimed is:

1. A photodetection device comprising:
a semiconductor layer having a first surface and a second surface located on opposite sides of the semiconductor layer in a thickness direction;
a photoelectric conversion part provided in the semiconductor layer;
first and second electric charge retaining parts provided adjacent to the first surface of the semiconductor layer;
a first transfer transistor that transfers signal electric charges generated by photoelectric conversion in the photoelectric conversion part to the first electric charge retaining part; and
a second transfer transistor that transfers the signal electric charges transferred by the first transfer transistor and retained in the first electric charge retaining part to the second electric charge retaining part, wherein
the first electric charge retaining part includes:
a semiconductor region provided adjacent to the first surface of the semiconductor layer; and
an electrode placed on the semiconductor region with an insulation film interposed between the electrode and the semiconductor region, and
an upstream side of the electrode in a direction in which the signal electric charges are transferred is narrower than a downstream side of the electrode in the direction in which the signal electric charges are transferred.

2. The photodetection device according to claim 1, wherein
a side of the electrode remote from the second electric charge retaining part is narrower than a side of the electrode adjacent to the second electric charge retaining part.

3. The photodetection device according to claim 1, wherein
the first transfer transistor and the first electric charge retaining part are arranged side by side in a first direction in plan view, and
the second electric charge retaining part, a second transistor, and the first electric charge retaining part are arranged side by side in a second direction intersecting the first direction in plan view.

4. The photodetection device according to claim 1, wherein
the electrode includes a small-width portion that becomes gradually narrower with an increase in distance from the second electric charge retaining part.

5. The photodetection device according to claim 1, wherein
the electrode includes a narrow portion that becomes narrower stepwise with an increase in distance from the second electric charge retaining part.

6. The photodetection device according to claim 4, wherein
the electrode includes a plurality of narrow portions arranged side by side in a direction intersecting the direction in which the signal electric charges are transferred in plan view.

7. The photodetection device according to claim 1, wherein
the first electric charge retaining part further includes a groove portion provided in the semiconductor region,
the electrode is provided in the groove portion, and
the semiconductor region faces, in the groove portion, a bottom surface and a side surface of the electrode with the insulation film interposed between the semiconductor region and the electrode.

8. The photodetection device according to claim 7, wherein
a downstream side of the groove portion in the direction in which the signal electric charges are transferred is shallower than an upstream side of the groove portion in the direction in which the signal electric charges are transferred.

9. The photodetection device according to claim 8, wherein
the groove portion becomes gradually shallower toward the second electric charge retaining part.

10. The photodetection device according to claim 8, wherein
the groove portion becomes shallower stepwise toward the second electric charge retaining part.

11. The photodetection device according to claim 7, wherein
two or more groove portions, including the groove portion, are provided side by side in a direction intersecting the direction in which the signal electric charges are transferred.

12. The photodetection device according to claim 1, wherein
the first electric charge retaining part further includes a pinning layer arranged between the semiconductor region and the insulation film.

13. The photodetection device according to claim 1, wherein the electrode is integrated with a gate electrode of the first transfer transistor.

14. A photodetection device comprising:

a semiconductor layer having a first surface and a second surface located on opposite sides of the semiconductor layer in a thickness direction; and a plurality of pixels provided in the semiconductor layer, wherein each of the plurality of pixels includes:

a photoelectric conversion part provided in the semiconductor layer; and two transfer systems that transfer signal electric charges generated by photoelectric conversion in the photoelectric conversion part to a corresponding second electric charge retaining part, each of the two transfer systems includes:

a first electric charge retaining part and the second electric charge retaining part provided adjacent to the first surface of the semiconductor layer;

a first transfer transistor that transfers the signal electric charges generated by photoelectric conversion in the photoelectric conversion part to the first electric charge retaining part; and a second transfer transistor that transfers the signal electric charges transferred by the first transfer transistor and retained in the first electric charge retaining part to the second electric charge retaining part, the first electric charge retaining part includes:

a semiconductor region provided adjacent to the first surface of the semiconductor layer; and an electrode placed on the semiconductor region with an insulation film interposed between the electrode and the semiconductor region, and an upstream side of the electrode in a direction in which the signal electric charges are transferred is narrower than the downstream side of the electrode in the direction in which the signal electric charges are transferred.

15. The photodetection device according to claim 14, wherein the first transfer transistor and the first electric charge retaining part are arranged side by side in a first direction in plan view, and the second electric charge retaining part, a second transistor, and the first electric charge retaining part are arranged side by side in a second direction intersecting the first direction in plan view.

16. The photodetection device according to claim 14, wherein the first electric charge retaining part has a planar shape with one side of the electrode of the first electric charge retaining part extending along one side of a gate electrode of the first transfer transistor.

17. The photodetection device according to claim 15, wherein the first electric charge retaining part is arranged over two of the pixels adjacent to each other in the first direction.

18. The photodetection device according to claim 14, wherein a gate electrode of the second transfer transistor extends from one end side to another end side in a width direction of the first electric charge retaining part.

19. The photodetection device according to claim 15, wherein the second electric charge retaining part is arranged in another one of the pixels adjacent to each other in the second direction.

20. An electronic device comprising:

a photodetection device;

an optical lens that forms an image of image light from a subject on an imaging surface of the photodetection device; and a signal processing circuit that performs signal processing on a signal output from the photodetection device, wherein the photodetection device includes:

a semiconductor layer having a first surface and a second surface located on opposite sides of the semiconductor layer in a thickness direction;

a photoelectric conversion part provided in the semiconductor layer;

first and second electric charge retaining parts provided adjacent to the first surface of the semiconductor layer;

a first transfer transistor that transfers signal electric charges generated by photoelectric conversion in the photoelectric conversion part to the first electric charge retaining part; and a second transfer transistor that transfers the signal electric charges transferred by the first transfer transistor and retained in the first electric charge retaining part to the second electric charge retaining part, the first electric charge retaining part includes:

a semiconductor region provided adjacent to the first surface of the semiconductor layer; and an electrode placed on the semiconductor region with an insulation film interposed between the electrode and the semiconductor region, and an upstream side of the electrode in a direction in which the signal electric charges are transferred is narrower than a downstream side of the electrode in the direction in which the signal electric charges are transferred.

* * * * *